US006600436B2

(12) United States Patent  
Tanaka

(10) Patent No.: US 6,600,436 B2  
(45) Date of Patent: Jul. 29, 2003

(54) D/A CONVERTER HAVING CAPACITANCES, TONE VOLTAGE LINES, FIRST SWITCHES, SECOND SWITCHES AND THIRD SWITCHES

(75) Inventor: Yukio Tanaka, Kanagawa (JP)

(73) Assignee: Semiconductor Energy Laboratory Co., Ltd, (JP)

(*) Notice: Subject to any disclaimer, the term of this patent is extended or adjusted under 35 U.S.C. 154(b) by 0 days.

(21) Appl. No.: 10/106,924

(22) Filed: Mar. 25, 2002

(65) Prior Publication Data  
US 2002/0186157 A1 Dec. 12, 2002

(30) Foreign Application Priority Data  
Mar. 26, 2001 (JP) .............................. 2001-087058

(51) Int. Cl.[7] ................................................ H03M 1/66
(52) U.S. Cl. ................................... 341/150; 341/144
(58) Field of Search .............................. 341/144, 153, 341/150, 154

(56) References Cited

U.S. PATENT DOCUMENTS

| | | | | |
|---|---|---|---|---|
| 4,200,863 A | * | 4/1980 | Hodges et al. ............ 341/156 |
| 4,713,649 A | | 12/1987 | Hino ......................... 340/347 |
| 5,134,400 A | | 7/1992 | Hash ......................... 341/136 |
| 5,274,373 A | | 12/1993 | Kanoh ....................... 341/118 |
| 5,389,928 A | * | 2/1995 | Coppero et al. ........... 341/144 |
| 5,594,569 A | | 1/1997 | Konuma et al. ........... 349/122 |
| 5,643,826 A | | 7/1997 | Ohtani et al. ............. 437/88 |
| 5,923,962 A | | 7/1999 | Ohtani et al. ............. 438/150 |
| 6,144,331 A | * | 11/2000 | Jiang ......................... 341/150 |
| 6,160,507 A | | 12/2000 | Carbou et al. ............. 341/144 |
| 6,271,783 B1 | | 8/2001 | Cairns et al. .............. 341/144 |
| 6,285,042 B1 | | 9/2001 | Ohtani et al. ............. 257/66 |
| 6,329,940 B1 | | 12/2001 | Dedic ........................ 341/144 |
| 6,380,876 B1 | | 4/2002 | Nagao ........................ 341/154 |
| 6,417,793 B1 | | 7/2002 | Bugeja et al. ............. 341/144 |
| 6,445,323 B1 | | 9/2002 | Cairns et al. .............. 341/144 |
| 6,445,325 B1 | | 9/2002 | Burns ......................... 341/144 |
| 6,473,020 B2 | | 10/2002 | Tsukamoto ................. 341/154 |

FOREIGN PATENT DOCUMENTS

| | | | |
|---|---|---|---|
| JP | 7-130652 | 5/1995 | ............ H01L/21/20 |
| JP | 11-167373 | 6/1999 | ............ G09G/3/18 |

OTHER PUBLICATIONS

"A Capacitive Array & Resistance Strings Shape DAC," *The Fundation of MOS Integrated Circuit*, pp. 162–165, figs. 5–39, Kindai Kagaku Sha Co., Ltd., May 5, 1992; with English abstract of pp. 164–165 subheading iii.

Inui, S. et al, "Thresholdless Antiferroelectricity in Liquid Crystals and its Application to Displays," J. Mater. Chem., vol. 6, No. 4, pp. 671–673, 1996.

Yoshida, T. et al, "A Full–Color Thresholdless Antiferroelectric LCD Exhibiting Wide Viewing Angle with Fast Response Time," SID 97 Digest, pp. 841–844, 1997.

Furue, H. et al, "Charateristics and Driving Scheme of Polymer–Stabilized Monostable FLCD Exhibiting Fast Response Time and High Contrast Ratio with Gray–Scale Capability," SID 98 Digest, pp. 782–785, 1998.

English abstract re Japanese patent application No. 7–130652, published May 19, 1995.

English abstract re Japanese patent application No. 11–167373, published Jun. 22, 1999.

U.S. patent application Ser. No. 09/990,251 (pending) to Tanaka et al, filed Nov. 21, 2001 including specification, claims, abstract, drawings and PTO filing receipt.

* cited by examiner

Primary Examiner—Peguy Jeanpierre  
(74) Attorney, Agent, or Firm—Cook, Alex, McFarron, Manzo, Cummings & Mehler, Ltd.

(57) ABSTRACT

Provided is a D/A converter circuit which copes with high-bit digital signals and has favorable linearity and small occupation area. In a capacitive divider type DAC, capacitances are simply provided in a one-to-one relationship correspondingly to lower order bit digital signals instead of providing capacitances one-to-one correspondingly to bits. In a reset period, voltages having a height corresponding to higher order bit digital signals are provided to one electrodes (first electrodes) of the capacitances thereby charging the capacitances. In a write period, voltages having a height corresponding to lower order bit digital signals are provided to the other electrodes (second electrodes) of the capacitances thereby charging the capacitances.

25 Claims, 12 Drawing Sheets

$(C_T = C_U[1]+C_U[2]+\cdots+C_U[m-1]+C_U[m])$

IMMEDIATELY BEFORE TERMINATING PRECHARGE PERIOD TP

IMMEDIATELY BEFORE TERMINATING WRITE PERIOD TA

IMMEDIATELY BEFORE TERMINATING RESET PERIOD TR

IMMEDIATELY BEFORE TERMINATING WRITE PERIOD TA

D/A CONVERTER HAVING CAPACITANCES, TONE VOLTAGE LINES, FIRST SWITCHES, SECOND SWITCHES AND THIRD SWITCHES

BACKGROUND OF THE INVENTION

1. Field of the Invention

This invention relates to a D/A converter (digital/analog converter) circuit (DAC) and, more particularly, to a DAC for use in a driver circuit of a semiconductor device. Further, the invention relates to a semiconductor device using such a DAC.

2. Description of the Related Art

Recently, researches and developments have been actively made on the thin film transistors (TFTs) using, in an active layer, a polysilicon film formed on a glass substrate. The TFT using a polysilicon film has a mobility higher by two orders of magnitude as compared to the TFT using an amorphous silicon film, and hence can sufficiently acquire a current value required for operating a circuit even where a TFT gate width is down scaled. Consequently, a system-on-panel is possible to realize having a pixel region of a matrix-formed flat display panel and a driver circuit thereof formed on the same substrate.

Realizing a system-on-panel makes it possible to reduce the cost owing to the reduction of display assembling and inspection processes. It also makes feasible the reduction in flat-panel display size and enhancement of definition.

In pursuing size reduction and definition enhancement furthermore of the flat display panel, it is problematic to realize a DAC capable of operating at high speed but less in occupation area on a substrate.

The DACs, although existing in various kinds, include representatively a capacitive divider type and a resistive divider type. The capacitive divider type DAC can operate at high speed with less area as compared to the resistive divider type.

FIG. 11 shows an example of a prior-art DAC of a capacitive divider type. The prior-art capacitive divider type DAC shown in FIG. 11 has switches SW[1]–SW[n] in the number of n to be controlled by the bits of n-bit digital signals $D_1$–$D_n$, capacitances C, 2C, . . . , $2^{n-1}$C in the number of n respectively connected to the switches, and a resetting switch $SW_R$. The prior-art DAC is connected with a power source A (voltage $V_A$) and a power source B (voltage $V_B$). The power sources A and B are kept at different voltages. The voltage of an analog signal outputted from the DAC is supplied onto an output line.

Note that, in the present description, voltage corresponds to a potential difference from a ground potential.

The corresponding-bit digital signals are respectively inputted to the switches SW[1]–SW[n]. Whether the capacitance is to be connected to the power source A or to the power source B is selected depending upon the information of 0 or 1 possessed by the input digital signal.

The operation of the prior-art DAC is explained in due order. The operation of the prior-art DAC is explained by separation with a reset period $T_R$ and a write period $T_A$.

At first, in a reset period $T_R$, the reset switch $SW_R$ closes. The digital signal is also reset to connect all the switches SW[1]–SW[n] to the same power source. It is herein assumed that connections are to the power source B. FIG. 12A shows an equivalent circuit diagram of the prior-art DAC at immediately before terminating the reset period. Note that $C_T$ means a resultant capacitance of all the capacitances.

After terminating the reset period $T_R$, a write period $T_A$ commences to open the reset switch $SW_R$. Subsequently, the digital signal in each bit having an arbitrary piece of information of 0 or 1 controls the switch SW[1]–SW[n]. The capacitances are connected to the power source A or B depending upon the bit of information. Due to this, the capacitances in the number of n are charged and thereafter placed in a steady state. The equivalent circuit diagram at this time is shown in FIG. 12B. Note that $C_A$ means a resultant capacitance of the capacitance connected to the power source A while $C_B$ a resultant capacitance of the capacitance connected to the power source B.

Due to a sequence of operations in the foregoing reset period $T_R$ and write period $T_A$, the digital signal can be converted into an analog signal.

The capacitive divider type DAC is expected in proceeding the size reduction of the flat panel display because its high-speed operation with comparatively less area as compared to the resistive divider type DAC as mentioned above. However, as the digital signal is increased in bits in order to enhance the definition of the flat panel display, it becomes difficult even for the capacitive divider type DAC to suppress an occupation area on the substrate.

Should a capacitive divider type DAC be designed with a reduced capacity in order to suppress its occupation area, reduced is the area and value of a capacitance corresponding to the lowermost order bit. In the capacitance, somewhat deviation occurs in capacitance value due to mask deviation or the like during manufacture. loosening of patterning, unexpected parasitic capacitance, etc. For this reason, the design with a reduced capacitance increases the deviation ratio of the capacitance corresponding to the lowermost bit to its capacitance value. This makes it difficult to form a capacitive divider DAC favored in linearity.

Meanwhile, the resistive divider type DAC, if the corresponding signal is increased in bits, causes increase in output resistance to make difficult high-speed operation besides making impossible the reduction of area.

In view of the foregoing problem, it is a problem to manufacture a DAC capable of reducing the area and operating at high speed even where the digital signals are increased in bits, in order to further reduce the size and enhance the definition of a flat panel display.

SUMMARY OF THE INVENTION

The present inventor has provided capacitances one-to-one correspondingly to the bits of the lower order bit digital signals instead of providing capacitances one-to-one correspondingly to the bits. It has been considered that, in a reset period, a voltage having a height corresponding to the higher order bit digital signal is provided to the one electrodes (first electrodes) of the capacitances to thereby charge the capacitances while, in a write period, a voltage having a height corresponding to the lower order bit digital signals is provided to the other electrodes (second electrodes) of the capacitances to thereby charge the capacitances. Hereinafter, a reset period is referred to as a precharge period.

Specifically, the capacitances are charged in a precharge period by controlling the operation of a resistive divider DAC or selector circuit due to a higher order bit digital signals.

In the case of a DAC corresponding, for example, to n-bit digital signals $D_1$–$D_n$ of the invention, there are provided a resistive divider type DAC (R-DAC) or selector circuit corresponding to the higher order (n−m)-bit (m<n) digital signals $D_{m+1}$–$D_n$ and capacitances in the number of m corresponding to the lower order m bits of $D_1$–$D_m$. Hereinafter, the capacitance in the number of m corresponding to the lower m bits are referred merely to as a capacitance ($C_U$).

The values of the capacitances in the number of m are represented as $C_U[1]=C$, $C_U[2]=2C$, $C_U[3]=2^2C$, ..., $C_U[m-1]=2^{m-2}C$ and $C_U[m]=2^{m-1}C$ (C is a constant), in the order of the capacitance corresponding to the lower order bit digital signal.

The DAC of the invention is connected to a power source A (voltage $V_A$), a power source B (voltage $V_B$), a power source C (voltage $V_C$) and a power source D (voltage $V_D$). In a write period $T_A$, voltage is supplied to the first electrode of the capacitances $C_U$ in the number of m by the power source C and power source D.

Meanwhile, the resistive divider type DAC or selector circuit corresponding to the higher order n–m bits possessed by the DAC of the invention is connected to the power source A and power source B. In a precharge period $T_P$, the higher order (n–m)-bit digital signals are converted into an analog signal. In the present description, the analog signal is referred to as a precharge analog signal (voltage $V_P$). The voltage of a precharge analog signal outputted from the resistive divider type DAC or selector circuit is supplied to the second electrodes of the capacitances $C_U$ in the number of m to charge these capacitances.

The second electrodes of all the capacitances $C_U$ are connected to one output line. Consequently, the voltage on the output line, in other words the voltage of an analog signal to be outputted from the DAC, is determined depending on the charge stored in the write period and precharge period.

The above configuration can form a DAC corresponding to high-bit digital signals without losing linearity while making use of the merit of the capacitive divider type that driving is possible at high speed and area can be comparatively suppressed.

DETAILED DESCRIPTION OF THE PREFERRED EMBODIMENTS

[Embodiment 1]

Figure 1:
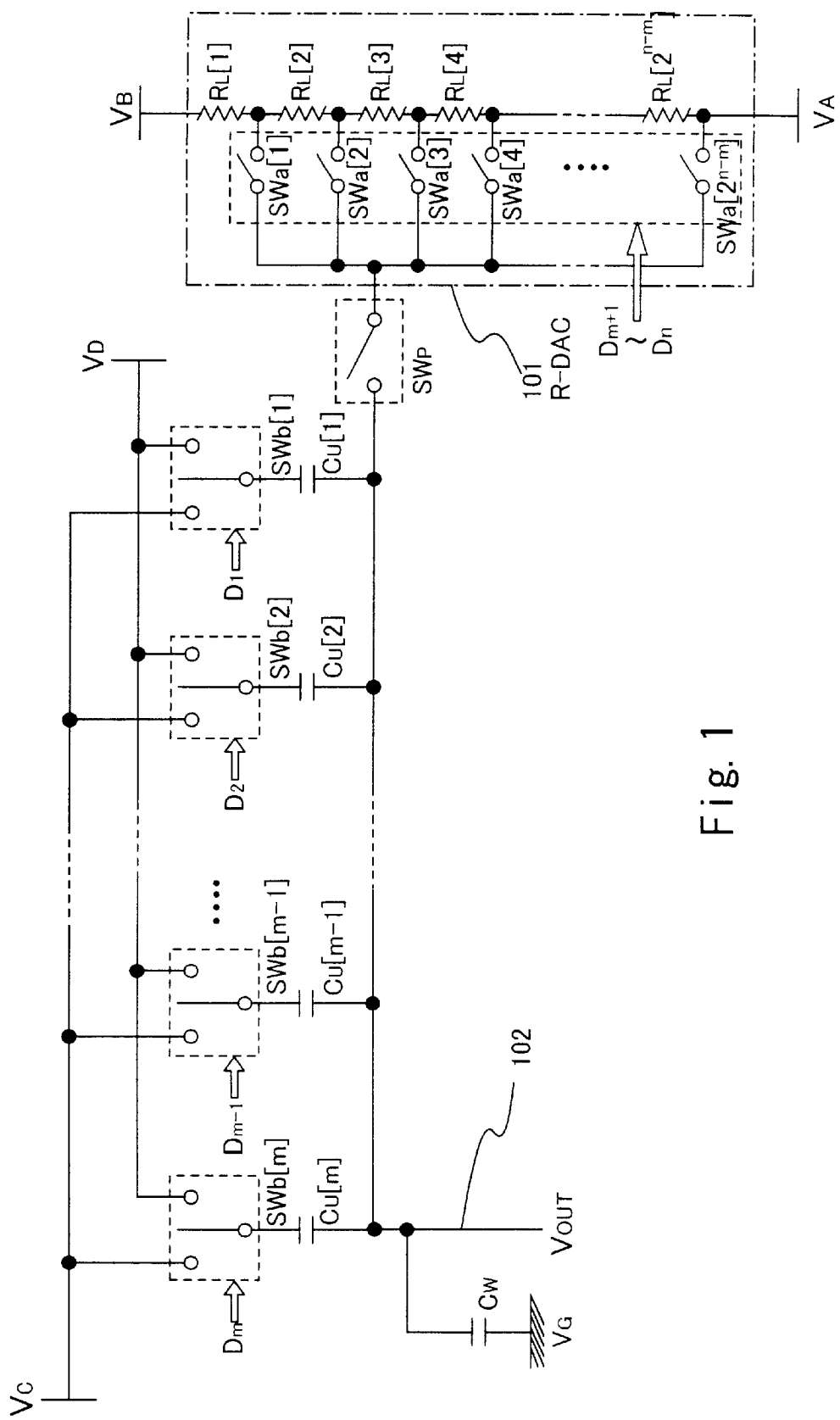
FIG. 1 is a diagram showing a configuration of a DAC having a configuration of the present invention.

FIG. 1 shows a configuration of a DAC of the present invention. The DAC shown in FIG. 1 converts higher order (n–m) bit digital signals into a precharge analog signal in a resistive divider circuit (R-DAC) 101.

Meanwhile, there are provided capacitances $C_U[1]$, $C_U[2]$, $C_U[3]$, ..., $C_U[m-1]$ and $C_U[m]$ in the number of m corresponding to the lower order m bits.

The values of capacitances $C_U$ are represented as $C_U[1]=C$, $C_U[2]=2C$, $C_U[3]=2^2C$, ..., $C_U[m-1]=2^{m-2}C$ and $C_U[m]=2^{m-1}C$ (C is a constant), in the order of the capacitance corresponding to the lower order bit.

The resistive divider circuit (R-DAC) 101 is connected to supply an output to the second electrodes of the capacitances $C_U$ in the number of m through a precharge switch $SW_P$. Namely, when the precharge switch $SW_P$ is off, the R-DAC 101 does not supply an output to the second electrodes of the capacitances $C_U$ in the number of m. When the precharge switch $SW_P$ is on, the R-DAC 101 supplies an output to the second electrodes of the capacitances $C_U$ in the number of m.

The switching of the precharge switch $SW_P$ is controlled according to a precharge signal (Pre).

The second electrodes of the capacitances CU in the number of m are all connected to an output line 102 (voltage $V_{OUT}$).

The R-DAC 101 has resistances $R_L[1]$, $R_L[2]$, $R_L[3]$, ..., $R_L[2^{n-m}]$ in the number of $2^{n-m}$ and switches $SWa[1]$, $SWa[2]$, $SWa[3]$, ..., $SWa[2^{n-m}]$ in the number of $2^{n-m}$.

Note that, in the present description, the resistance has at least two terminals. The terminals include an input/output terminal to provide an input to or output from the resistance and, besides, a common terminal common to an input and an output. In the present invention, the two input/output terminals of a resistance are referred to as resistance terminals.

The resistances in the number of $2^{n-m}$ all have the same resistance value represented as $R_L[1]=R_L[2]=R_L[3]=...=R_L[2^{n-m}]=R$ (R is a constant). The resistances $R_L[1]$, $R_L[2]$, $R_L[3]$, ..., $R_L[2^{n-m}]$ in the number of $2^{n-m}$ are all connected in series wherein the resistances $R_L[1]$ and $R_L[2^{n-m}]$ positioned at the both ends of connection are respectively connected to a power source B and a power source A.

Meanwhile, connection is made to output, from the R-DAC 101, the voltages of between the resistances connected in series and the voltage of the power source A, respectively, through the switches $SWa[1]$, $SWa[2]$, $SWa[3]$, ..., $SWa[2^{n-m}]$ in the number of $2^{n-m}$. Namely, when the SWa[t] (t=1 to n–m–1) is on, the voltage between $R_L[t]$ and $R_L[t+1]$ is equal to the output voltage of the R-DAC 101. Connection is made in such a way that, when the SWa[n–m] is on, the output of R-DAC 101 is equal to the voltage $V_A$ of the power source A.

The output is supplied to the second electrodes of the capacitance $C_U$ in the number of m through the precharge switch $SW_P$.

Note that, differently from FIG. 1, connection may be made to output, from the R-DAC 101, the voltages of between the resistances connected in series and the voltage of the power source B, respectively, through the switches $SWa[1]$, $SWa[2]$, $SWa[3]$, ..., $SWa[2^{n-m}]$ in the number of $2^{n-m}$.

The capacitances $C_U$ respectively have first electrodes connected to a power source C or power source D through switches SWb[1], SWb[2], ..., SWb[m–1] and SWb[m] in the number of m in the order from the capacitance corresponding to the lower order bit.

The lower order m bits are inputted to the switches SWb[1], SWb[2], ..., SWb[m–1] and SWb[m] in the number of m. During a write period, the switches SWb[1], SWb[2], ..., SWb[m-1] and SWb[m] in the number of m are controlled in switching according to the information of 1 or 0 possessed by the lower order m bits.

The output line 102 has an interconnection capacitance ($C_W$). $V_G$ means a ground voltage. Note that the interconnection capacitance is not necessarily formed between the ground and the output line 102 but may be formed between a power source other than the ground and the output line.

Figure 2:
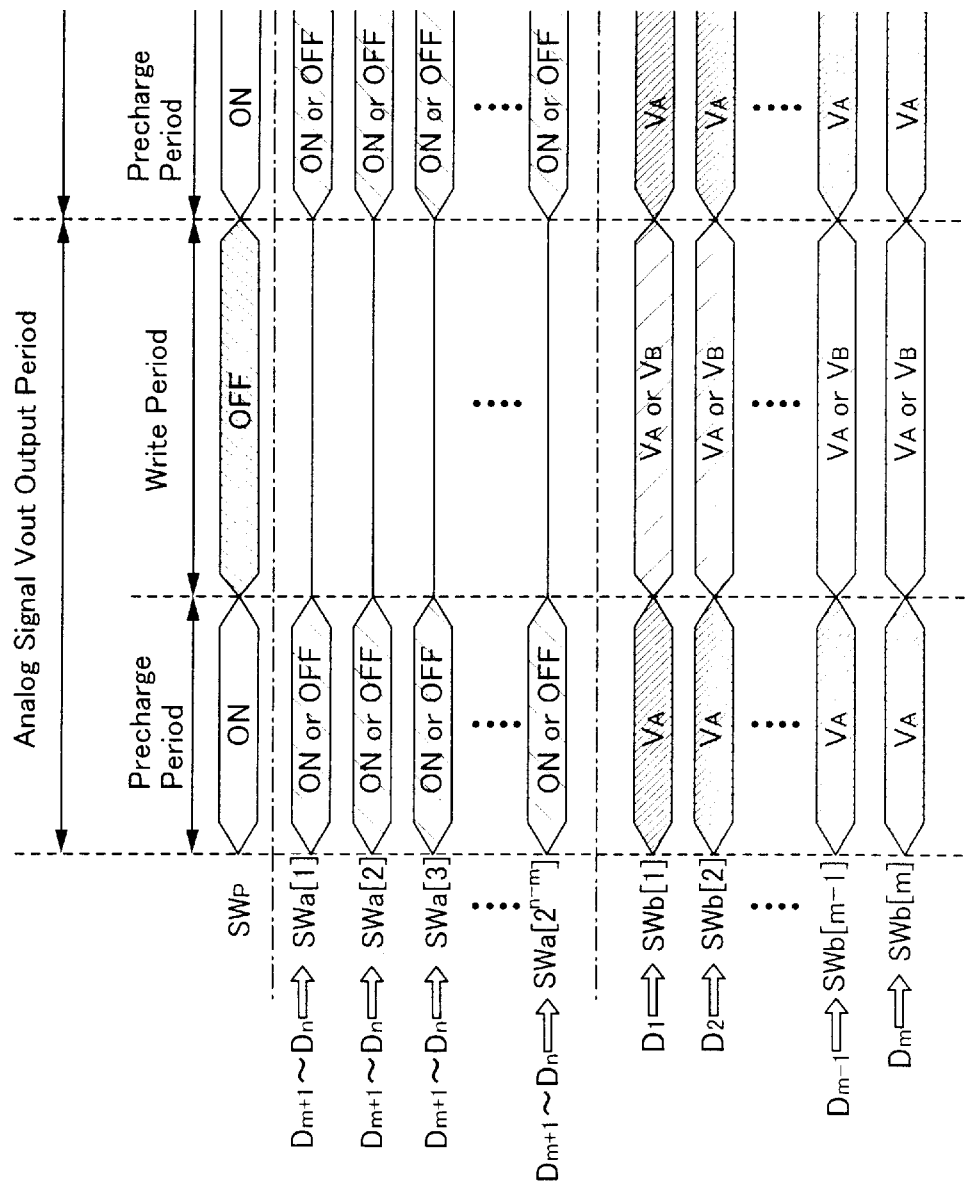
FIG. 2 is a chart for explaining switch operation possessed by the DAC of the invention.

The operation of the DAC of the invention shown in FIG. 1 will be explained in due order. The operation of the DAC of the invention is explained by separation with a precharge period $T_P$ and a write period $T_A$. FIG. 2 shows the operation in a precharge period $T_P$ and write period $T_A$ of the switches possessed by the DAC of the invention.

At first, in a precharge period $T_P$, the precharge switch $SW_P$ is turned on (ON) by a precharge signal (Pre).

The switches SWa[1], SWa[2], ..., SWa[$2^{n-m}$-1] and SWa[$2^{n-m}$] in the number of $2^{n-m}$ corresponding to the higher order (n-m) bits are controlled in operation by the higher order (n-m)-bit digital signals $D_{m+1}, D_{m+2}, \ldots D_{n-1}$ and $D_n$.

Specifically, the higher order (n-m)-bit digital signals $D_{m+1}$–$D_n$, respectively have pieces of information of 1 or 0. There are $2^{n-m}$ combinations of the pieces of information of 1 and 0 possessed by the higher order (n-m)-bit digital signals. Any one of the switches SWa[1], SWa[2], ..., SWa[$2^{n-m}$-1] and SWa[$2^{n-m}$] in the number of $2^{n-m}$ is selected and turned on according to the $2^{n-m}$ combinations of the pieces of information.

For example, when the switch SWa[x] ($1 \leq x \leq 2^{n-m}$) is selected and turned on, the voltage $V_L$ of the precharge analog signal is expressed by the following two equations.

$$V_L = \frac{(R_L[1] + \ldots + R_L[x-1])}{(R_L[1] + \ldots + R_L[2^{n-m}])}(V_B - V_A) + V_A \quad \text{[Equation 2]}$$

Because the resistance values of the resistances $R_L[1]$, $R_L[2], R_L[3], \ldots, R_L[2^{n-m}]$ in the number of $2^{n-m}$ all are the same, the following Equation 3 is derived from Equation 2.

$$V_L = \frac{x-1}{2^{n-m}}(V_B - V_A) + V_A \quad \text{[Equation 3]}$$

The voltage ($V_L$) having a value determined by x in Equation 3 is outputted as a precharge analog signal from R-DAC 101.

The precharge analog signal voltage $V_L$ is supplied to the second electrode of the capacitance $C_U$ and to the output line 102 through the precharge switch $SW_P$.

Furthermore, by the lower order m-bit digital signals, the switches SWb[1], SWb[2], ..., SWb[m-1] and SWb[m] in the number of m corresponding to the lower order m bits are all connected to the power source C.

Figure 3A:
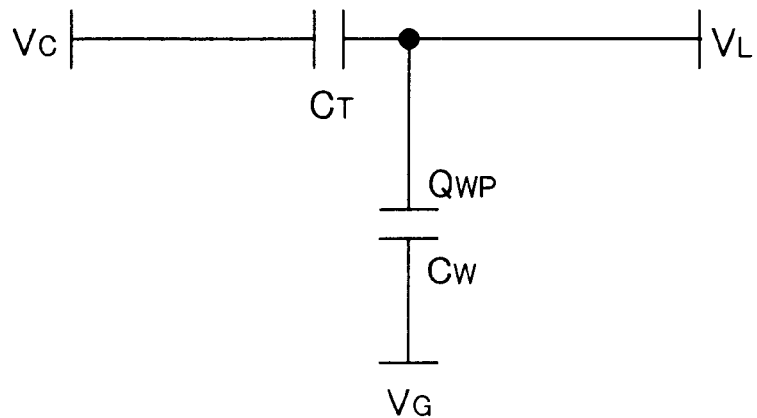
FIGS. 3A and 3B are equivalent circuit diagrams to the DAC of the invention.

The equivalent circuit diagram of the DAC of the invention immediately before terminating the precharge period $T_P$ is shown in FIG. 3A. The capacitance $C_T$ corresponds to a resultant capacitance of all the capacitances $C_U[1], C_U[2], C_U[3], \ldots, C_U[m]$.

The total charge $Q_{WP}$ stored on the interconnection capacitance ($C_W$) and capacitance $C_T$ in the precharge period $T_P$ is expressed by the following Equation 4:

$$Q_{WP}=C_W \cdot (V_L-V_G)+C_T \cdot (V_L-V_C) \quad \text{[Equation 4]}$$

After terminating the precharge period $T_P$, the precharge switch $SW_P$ turns off. Then, a write period $T_A$ commences.

The switches SWb[1], SWb[2], ..., SWb[m-1] and SWb[m] in the number of m corresponding to the lower order m bits correspond, one to one, to the lower order m-bit digital signals $D_1, D_2, \ldots D_{m-1}$ and $D_m$. In the write period $T_A$, the switch is controlled in operation according to the information of 0 or 1 possessed by each bit.

Specifically, connection is made between the first electrodes of the capacitances $C_U[1], C_U[2], \ldots C_U[m]$ and the power source C or D through the switches SWb[1], SWb[2], ..., SWb[m-1] and SWb[m] in the number of m. Whether connected to the power source C or D is determined depending on the information 1 or 0 possessed by each bit of the lower order m bits of the digital signal.

Incidentally, in the write period, the switches SWa[1], SWa[2], SWa[3], ..., SWa[$2^{n-m}$] in the number of $2^{n-m}$ may be any of on and off.

Figure 3B:
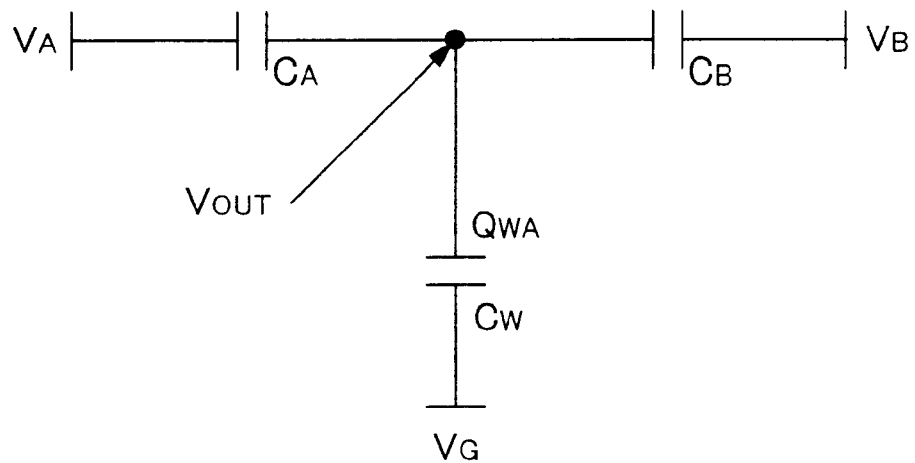

FIG. 3B shows an equivalent circuit diagram of the DAC of the invention at immediately before terminating the write period $T_A$. The capacitance $C_A$ is a resultant capacitance of those connected to the power source C of among all the capacitances $C_U$. Meanwhile, the capacitance $C_B$ is a resultant capacitance of those connected to the power source D of among all the capacitances $C_U$. Accordingly, it can be considered that the following relationship of Equation 5 is held.

$$C_T=C_A+C_B \quad \text{[Equation 5]}$$

Meanwhile, $C_A$ and $C_B$ are held in the relationship of the following Equation 6:

$$C_A+C_B=C \cdot (1+2+2^2+\ldots+2^{m-1})=C \cdot (2^m-1) \quad \text{[Equation 6]}$$

The charge $Q_{WA}$ stored on the capacitances $C_W$, $C_A$ and $C_B$ in the write period $T_A$ is expressed by the following Equation 7:

$$Q_{WA}=C_W \cdot (V_{OUT}-V_G)+C_B \cdot (V_{OUT}-V_D)+C_A \cdot (V_{OUT}-V_C) \quad \text{[Equation 7]}$$

Herein, the charge $Q_{WP}$ and the charge $Q_{WA}$ become equal due to the conservation of electric charge. Therefore, the following Equation 8 is derived from Equation 4 and Equation 6.

$$C_W \cdot (V_L-V_G)+C_T \cdot (V_L-V_C)=C_W \cdot (V_{OUT}-V_G)+C_B \cdot (V_{OUT}-V_D)+ \\ C_A \cdot (V_{OUT}-V_C) \quad \text{[Equation 8]}$$

From Equations 8 and 5, the following Equation 9 is derived.

$$V_{OUT} = V_L + \frac{C_B \cdot (V_D - V_C)}{C_W + C_T} \quad \text{[Equation 9]}$$

From Equations 3, 5, 6 and 9, the following Equation 10 is derived:

$$V_{OUT} = \frac{x-1}{2^{n-m}}(V_B - V_A) + V_A + \frac{C_B \cdot (V_D - V_C)}{C_W + C \cdot (2^m - 1)} \quad \text{[Equation 10]}$$

When the value of x is fixed, in order to change $V_{OUT}$ by one tonal level, $C_B$ varies by a unit capacitance C. Accordingly, from Equation 10, the difference $\Delta_1$ of one tonal level of $V_{OUT}$ when the value x is fixed is expressed by the following Equation 11.

$$\Delta_1 = \frac{C \cdot (V_D - V_C)}{C_W + C \cdot (2^m - 1)} \qquad \text{[Equation 11]}$$

Consideration is made on the case that the value of x is varied to vary $V_{OUT}$ by one tonal level. Because the switch SWa[x] is controlled by the higher order bit, in a tonal level, e.g., immediately before x increases by one, the lower order bit has information that all the capacitances are connected to the power source D, thus resulting in $C_B = C_T$. In a tonal level that x has increased by one, the lower order bit has information that all the capacitances are connected to the power source C, thus resulting in $C_B = 0$.

Consequently, from Equation 10, a difference $\Delta_2$ by one tonal level of $V_{OUT}$, when the value of x is variable, is expressed by the following Equation 12.

$$\Delta_2 = \frac{1}{2^{n-m}}(V_B - V_A) - \frac{C_T \cdot (V_D - V_C)}{C_W + C \cdot (2^m - 1)} \qquad \text{[Equation 12]}$$

The linearity of analog signal voltage $V_{OUT}$ requires to make equal $\Delta_1$ and $\Delta_2$. Accordingly, the following Equation 13 is derived from Equations 11 and 12.

$$(V_D - V_C) = \frac{1}{2^n \cdot C}(V_B - V_A)\{C_W + C \cdot (2^m - 1)\} \qquad \text{[Equation 13]}$$

Figure 4:
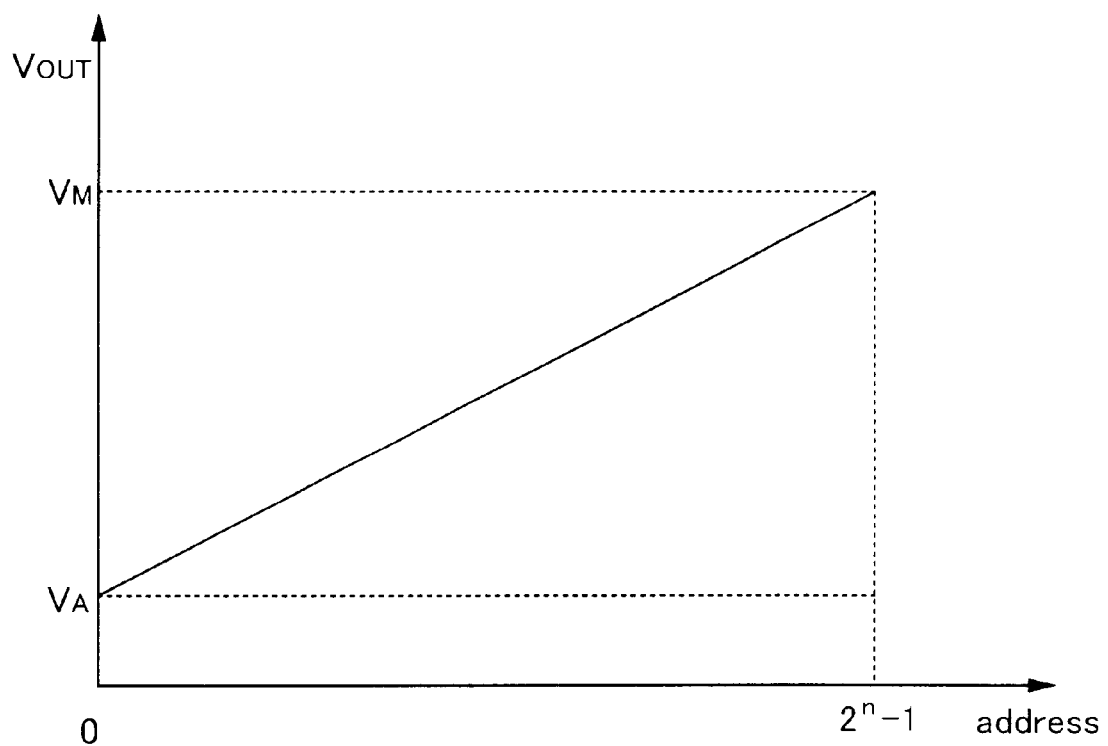
FIG. 4 is a diagram showing a relationship between the bits of a digital signal and a voltage of an output analog signal.

The analog signal voltage $V_{OUT}$ against the n-bit digital signals shown in Equation 10, satisfying Equation 13, is shown in a graph of FIG. 4. As shown in FIG. 4, the analog signal voltage $V_{OUT}$ has linearity at between $V_A$ and $V_M$ against input n-bit digital signals. Incidentally, $V_M$ is expressed by the following Equation 14.

$$V_M = \frac{2^n - 1}{2^{n-m}}(V_B - V_A) + V_A + \frac{C \cdot (2^m - 1)(V_D - V_C)}{C_W + C \cdot (2^m - 1)} \qquad \text{[Equation 14]}$$

The n-bit digital signals can be converted into an analog signal by the sequential operation of the foregoing precharge period $T_P$ and write period $T_A$.

The invention can form a DAC corresponding to high-bit digital signals without losing linearity while making use of the merit of the capacitive divider type that is capable of driving at high speed and suppressing area comparatively small.

[Embodiment 2]

This embodiment explains a configuration using a selector circuit in place of the R-DAC in the DAC of the invention.

Figure 5:
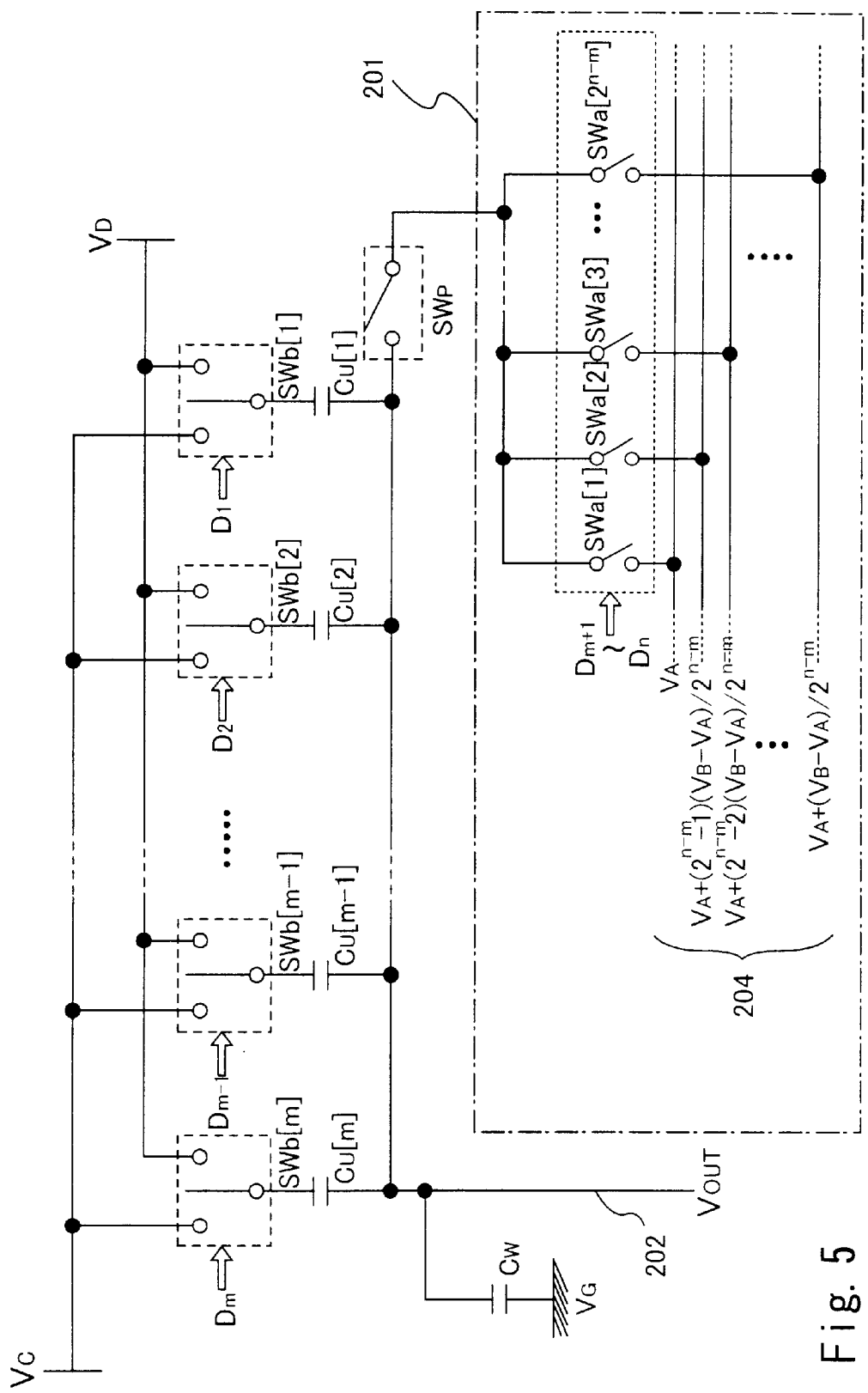
FIG. 5 is a diagram showing a configuration of a DAC having a configuration of the present invention.

FIG. 5 shows a configuration of a DAC of the invention using a selector circuit. In the DAC shown in FIG. 5, the higher order (n-m)-bit digital signals are converted into a precharge analog signal in a selector circuit 201.

Also, there are provided capacitances $C_U[1]$, $C_U[2]$, $C_U[3]$, ..., $C_U[m-1]$ and $C_U[m]$ in the number of m corresponding to the lower order m bits.

The values of the capacitances $C_U$ are represented as $C_U[1]=C$, $C_U[2]=2C$, $C_U[3]=2^2C$, ..., $C_U[m-1]=2^{m-2}C$ and $C_U[m]=2^{m-1}C$, in the order of the capacitance corresponding to the lower order bit.

The selector circuit 201 has tone voltage line 204 in the number of $2^{n-m}$ and switches SWa[1], SWa[2], SWa[3], ..., SWa[$2^{n-m}$] in the number of $2^{n-m}$.

The voltages on the tone voltage lines 204 are respectively expressed as $V_A$, $V_B+(V_A-V_B)/2^{n-m}$, $V_B+2(V_A-V_B)/2^{n-m}$, $V_B+3(V_A-V_B)/2^{n-m}$, ..., $V_B+(2^{n-m}-1)(V_A-V_B)/2^{n-m}$.

Connection is made respectively between the switches SWa[1], SWa[2], SWa[3], ..., SWa[$2^{n-m}$] in the number of $2^{n-m}$ and the tone voltage lines 204, to output the voltages of the tone voltage lines 204 through the switches SWa[1], SWa[2], SWa[3], ..., SWa[$2^{n-m}$] in the number of $2^{n-m}$.

The voltage outputted from the selector circuit 201 is supplied to the second electrode of the capacitance $C_U$ and to an output line 202 through a precharge switch $SW_P$.

The capacitance $C_U$ has first electrodes connected to the power source C or D respectively through switches SWb[1], SWb[2], ..., SWb[m-1] and SWb[m] in the number of m in the order from the capacitance corresponding to the lower order bit.

Whether the second electrode is connected to either the power source C or the power source D is determined depending on the information possessed by each bit of the lower order m bits inputted to the switch SWb[1], SWb[2], ..., SWb[m-1] or SWb[m].

The precharge switch $SW_P$ is controlled in switching according to a precharge signal (Pre).

The output line 202 has an interconnection capacitance ($C_W$). $V_G$ means a ground voltage. Note that the interconnection capacitance is not necessarily formed between the ground and the output line 202 but may be formed between a power source other than the ground and the output line.

Now, the operation of the DAC of the invention shown in FIG. 5 is explained by separation with a precharge period $T_P$ and a write period $T_A$. The operation of each switch is similar to the case shown in Embodiment 1 and the explanation thereof is omitted herein. By controlling the operation of each switch by the use of a digital signal, the voltage of an analog signal inputted to the output line has linearity with respect to the bit of the digital signal.

The invention can form a DAC corresponding to the high-bit digital signals without losing linearity while making use of the merit of the capacitive divider type that is capable of driving at high speed and suppressing area comparatively small.

EXAMPLES

Explanations will be made below on the example of the present invention.

Example 1

This example explains the case with m=n-2 in the DAC of the invention shown in FIG. 1.

Figure 6:
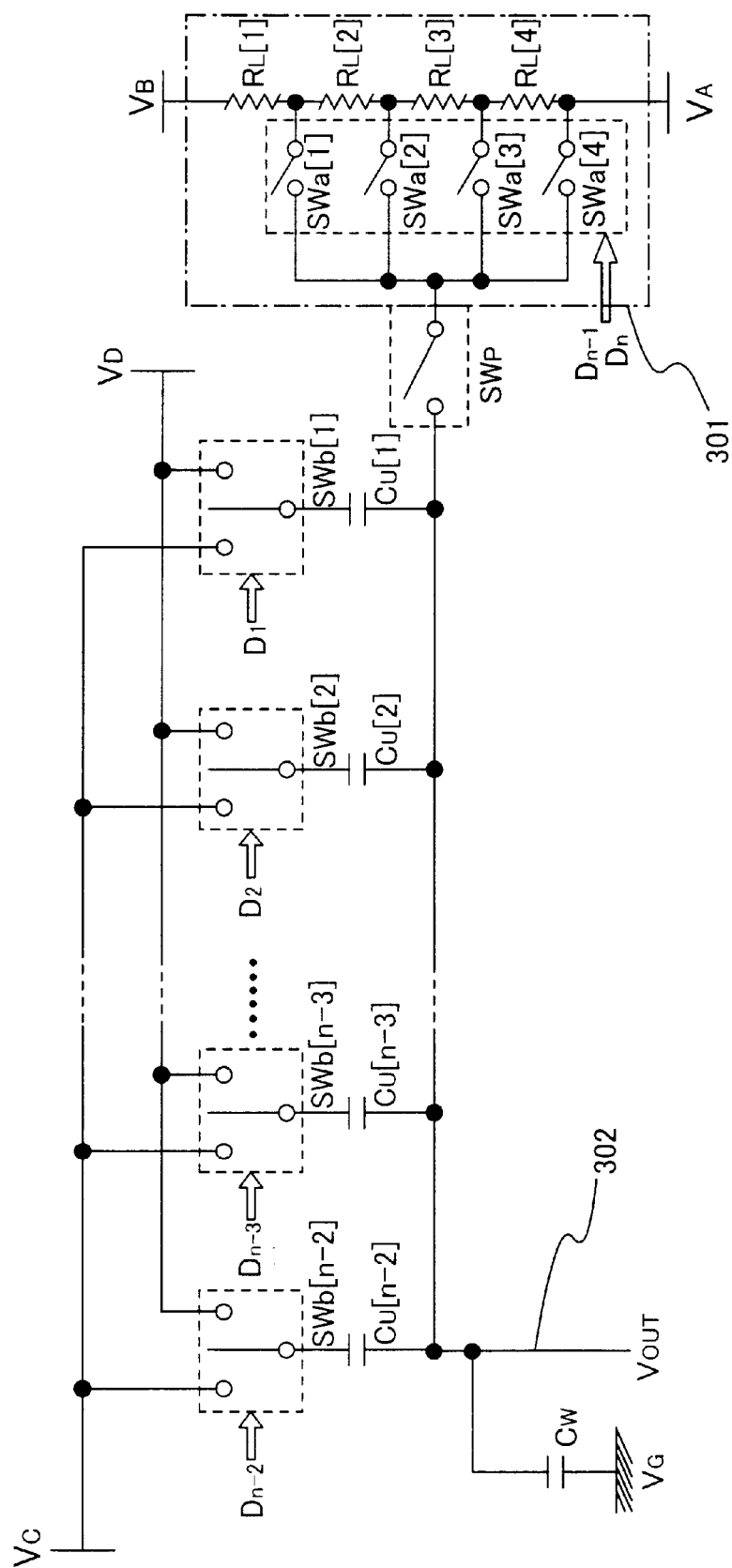
FIG. 6 is a diagram showing a configuration of a DAC having a configuration of the present invention.

FIG. 6 shows a configuration of the DAC of this example. The DAC shown in FIG. 6 converts the higher order 2-bit digital signals into a precharge analog signal in the resistive divider circuit 301.

Meanwhile, there are provided capacitances $C_U[1]$, $C_U[2]$, $C_U[3]$, ..., $C_U[n-3]$ and $C_U[n-2]$ in the number of n-2 corresponding to the lower order n-2 bits.

The values of capacitances $C_U$ are represented as $C_U[1]=C$, $C_U[2]=2C$, $C_U[3]=2^2C$, ..., $C_U[n-3]=2^{n-4}C$ and $C_U[n-2]=2^{n-3}C$, in the order of the capacitance corresponding to the lower order bit.

The output of a resistive divider circuit (R-DAC) 301 is connected to a second electrodes of the capacitances $C_U$ and to an output line $V_{OUT}$ through a precharge switch $SW_P$. The precharge switch $SW_P$ is controlled in switching according to a precharge signal (Pre).

The R-DAC 301 has four resistances $R_L[1]$, $R_L[2]$, $R_L[3]$, $R_L[4]$ and four switches SWa[1], SWa[2], SWa[3], SWa[4].

The four resistances all have the same resistance value represented as $R_L[1]=R_{L[2]}=R_L[3]=R_L[4]=R$ (R is a constant).

The four resistances $R_L[1]$, $R_L[2]$, $R_L[3]$, $R_L[4]$ are all connected in series wherein the resistances $R_L[1]$ and $R_L[4]$ positioned at the both ends of connection are respectively connected to a power source B and a power source A.

The four resistances $R_L[1]$, $R_L[2]$, $R_L[3]$, $R_L[4]$ and the four switches SWa[1], SWa[2], SWa[3], SWa[4] are connected to output the voltages of between the resistances connected in series and the voltage of power source A from the R-DAC 301 respectively through the four switches SWa[1], SWa[2], SWa[3], SWa [4].

The capacitances $C_U$ has first electrodes connected to a power source C or D respectively through the switches SWb[1], SWb[2], . . . , SWb[n-3] and SWb[n-2] in the number of n-2 in the order from the capacitance corresponding to the lower order bit.

In a write period, whether one electrode of the capacitance is connected to either of the power source C or the power source D is determined depending on the information possessed by each bit of the lower n-2 bits inputted to the switch SWb[1], SWb[2], . . . SWb[n-3] or SWb[n-2].

The output line 302 has an interconnection capacitance ($C_W$). $V_G$ means a ground voltage. Note that the interconnection capacitance is not necessarily formed between the ground and the output line 302 but may be formed between a power source other than the ground and the output line.

Now, the operation of the DAC of the invention shown in FIG. 6 is explained by separation with a precharge period $T_P$ and a write period $T_A$. The operation of each switch is similar to that in Embodiment 1 and hence the explanation thereof is herein omitted. By controlling the operation of each switch by the use of a digital signal, the voltage of an analog signal inputted to the output line has linearity with respect to the bit of the digital signal.

The invention can form a DAC corresponding to the higher order bit digital signals without losing linearity while making use of the merit of the capacitive divider type that is capable of driving at high speed and suppressing area comparatively small.

Incidentally, although this example described on the case with m=n-2, the invention is not limited to this. It is possible for a designer to properly select a value of m.

Example 2

This example explains the case with m=n-2 in the DAC of the invention shown in FIG. 5.

Figure 7:
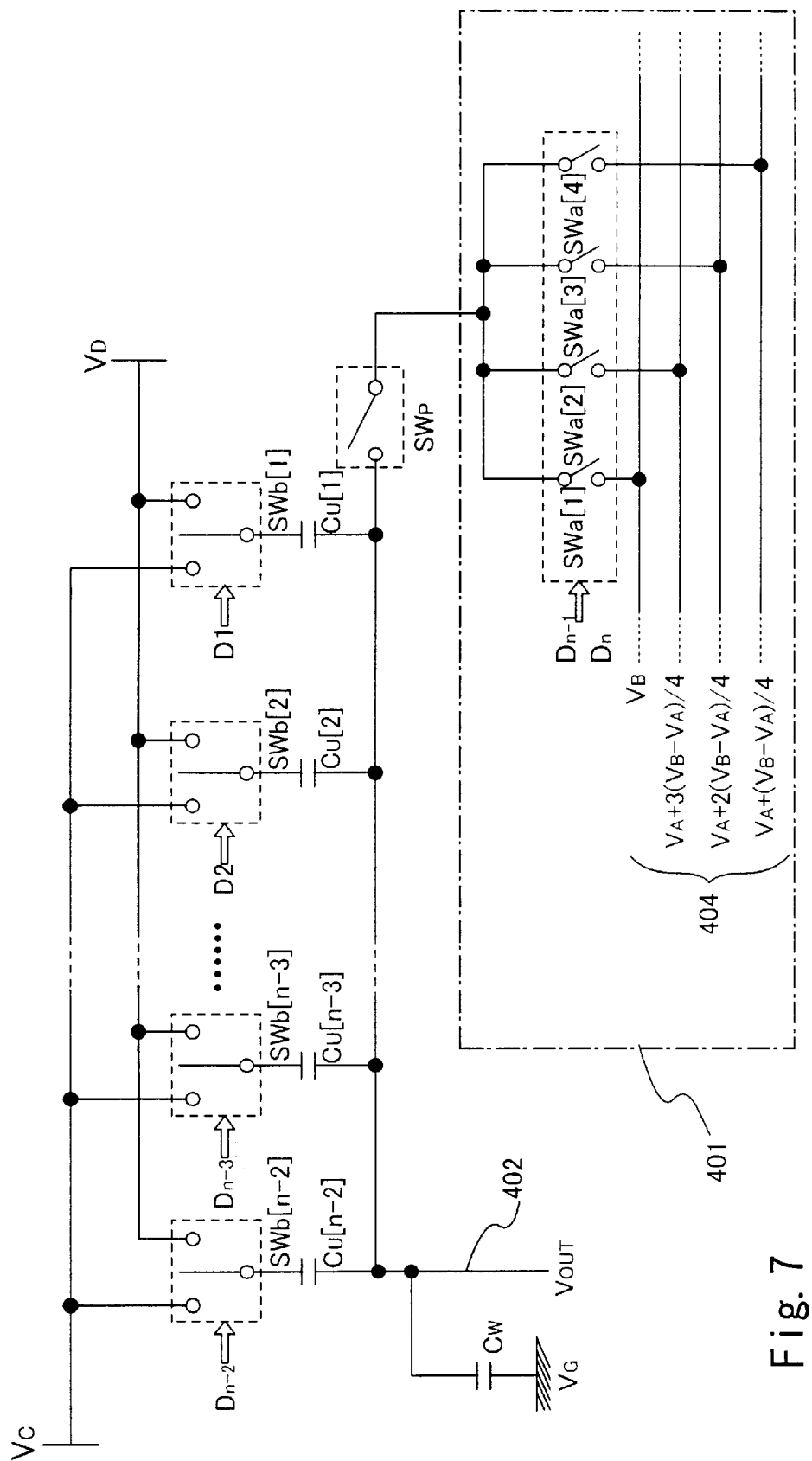
FIG. 7 is a diagram showing a configuration of a DAC having a configuration of the present invention.

FIG. 7 shows a configuration of the DAC of this example. The DAC shown in FIG. 7 converts the higher order 2-bit digital signals into a precharge analog signal in the selector circuit 401, thereby converting n-bit digital signals into an analog signal.

Meanwhile, there are provided capacitances $C_U[1]$, $C_U[2]$, $C_U[3]$, . . . , $C_U[n-3]$ and $C_U[n-2]$ in the number of n-2 corresponding to the lower order n-2 bits.

The values of capacitances $C_U$ are represented as $C_U[1]=C$, $C_U[2]=2C$, $C_U[3]=2^2C$, . . . , $C_U[n-3]=2^{n-4}C$ and $C_U[n-2]=2^{n-3}C$, in the order of the capacitance corresponding to the lower order bit.

The selector circuit 401 has four tone voltage lines 404 and four switches SWa[1], SWa[2], SWa[3], SWa[4].

The voltages on the tone voltage lines 404 are respectively expressed as $V_A$, $V_A+(V_B-V_A)/4$, $V_A+2(V_B-V_A)/4$, $V_A+3(V_B-V_A)/4$.

The tone voltage lines 404 and the switches SWa[1], SWa[2], SWa[3], SWa[4] are respectively connected to output the voltage of the tone voltage line 404 from the selector circuit 401 through the switch SWa[1], SWa[2], SWa[3] or SWa[4].

The voltage outputted from the selector circuit 401 is supplied to the second electrodes of capacitances $C_U$ and to an output line 202 through a precharge switch $SW_P$.

The capacitances $C_U$ have first electrodes connected to the power source C or D through respective switches SWb[1], SWb[2], . . . , SWb[n-1] and SWb[n-2] in the number of n-2 in the order from the capacitance corresponding to the lower order bit.

Whether the first electrode of the capacitance $C_U$ is connected to either the power source C or the power source D is determined depending on the information possessed by each bit of the lower order n-2 bits inputted to the switch SWb[1], SWb[2], . . . , SWb[n-3] or SWb[n-2].

The precharge switch $SW_P$ is controlled in switching according to a precharge signal (Pre).

The output line 402 has an interconnection capacitance ($C_W$). $V_G$ means a ground voltage. Note that the interconnection capacitance is not necessarily formed between the ground and the output line 402 but may be formed between a power source other than the ground and the output line.

Now, the operation of the DAC of the invention shown in FIG. 7 is explained by separation with a precharge period $T_P$ and a write period $T_A$. The operation of each switch is similar to the case shown in Embodiment 1 and the explanation thereof is omitted herein. By controlling the operation of each switch by the use of a digital signal, the voltage of an analog signal inputted to the output line has linearity with respect to the bit of the digital signal.

The invention can form a DAC corresponding to the higher order bit digital signals without losing linearity white making use of the merit of the capacitive divider type that is capable of driving at high speed and suppressing area comparatively small.

Example 3

This example shows one example of a switch corresponding to the higher order bits used in the DAC of the invention.

Figure 8:
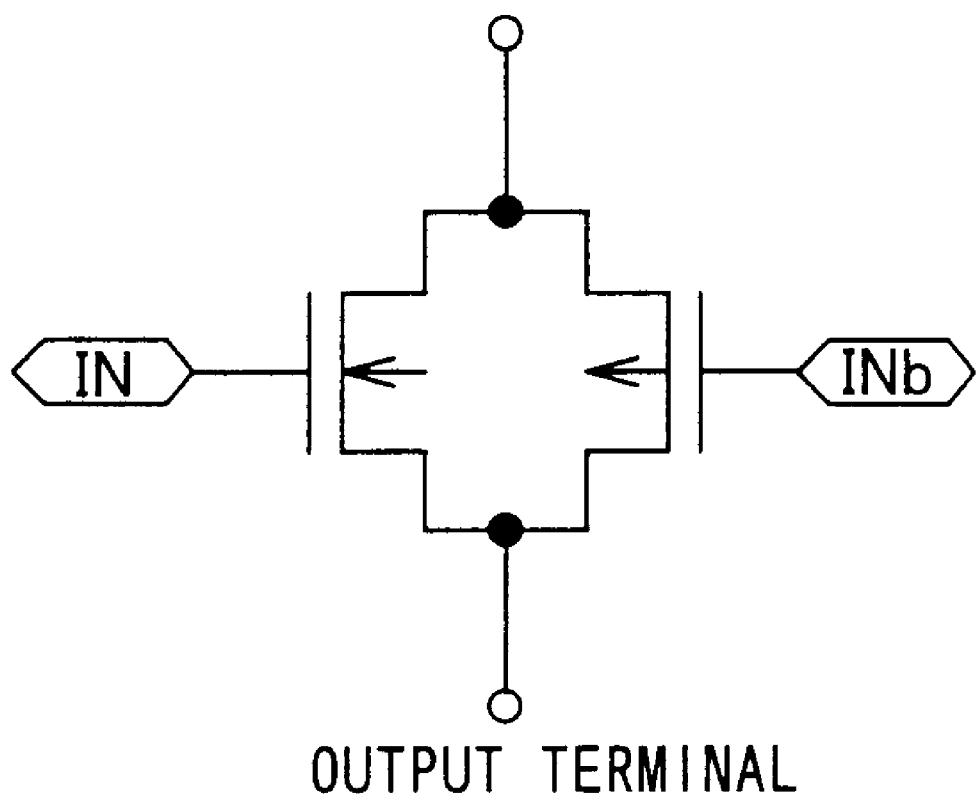
FIG. 8 is a circuit diagram of a switch to be used in the DAC of the invention.

The switch of this example in FIG. 8 is a transmission gate having an n-channel transistor TFT and a p-channel transistor TFT. A digital signal and a signal of the digital signal inverted in polarity (inverted digital signal) are respectively inputted to IN and INb.

By the digital signal and inverted digital signal inputted to IN and INb, a voltage supplied to an input terminal is sampled and supplied to an output terminal.

Meanwhile, the switch corresponding to the lower order bit has two transmission gates shown in FIG. 8. The two transmission gates have input signals to IN and INb alternately.

The switch used in the DAC of the invention is not limited to the configuration shown in FIG. 8.

It is noted that the configuration of this example can be carried out by a free combination with Examples 1 and 2.

Example 4

An example of a process of manufacturing a TFT used in a DAC of the present invention is explained in Example 4. Note that although processes for manufacturing a p-channel TFT and an n-channel TFT are only shown in FIGS. 9A to 9E, it is possible to produce all transistors used by the present invention based on the processes in FIGS. 9A to 9E.

Figure 9A:
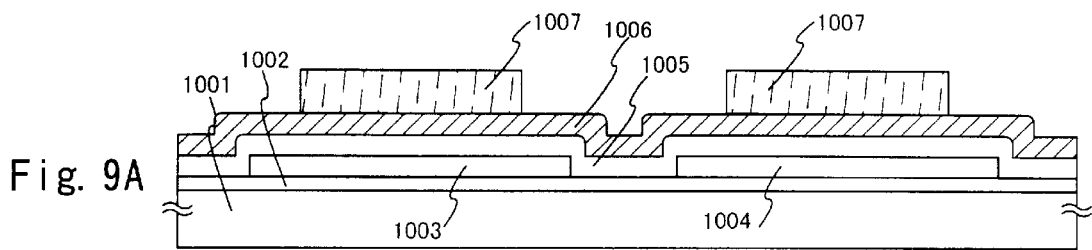
FIGS. 9A to 9E are views showing a manufacturing process for TFTs.

In addition to a glass substrate such as barium borosilicate glass or aluminum borosilicate glass, typically Corning Corp. #7059 or #1737, a plastic substrate having no optical anisotropy such as polyethelylene terephthalate (PET), polyethylene naphthalate (PEN), or polyethel sulfon (PES) can be used in a substrate 1001 in FIG. 9A. Further, a quartz substrate may also be used. If heat treatment is performed in advance at a temperature on the order of 10 to 20° C. less than the distortion point of the glass when using a glass substrate, then changes in shape of the glass substrate in subsequent processes can be prevented.

A base film 1002 having a thickness of 10 to 200 nm is formed from an insulating film such as a silicon oxide film, a silicon nitride film, or a silicon nitride oxide film, on the surface of the substrate 1001 on which TFTs will be manufactured, in order to prevent impurity element diffusion. The base film may be formed by one layer of the insulating film, and may also be formed by a plurality of layers.

Island shape semiconductor layers 1003 and 1004 are formed from a crystalline semiconductor film in which a semiconductor film having an amorphous structure is crystallized by a method such as laser annealing, thermal annealing, or rapid thermal annealing (RTA). Further, a crystalline semiconductor film formed by a method such as sputtering, plasma CVD, or thermal CVD may also be used. Alternatively, the crystalline semiconductor layers 1003 and 1004 can also be formed by a crystallization method using a catalytic element, in accordance with a technique disclosed by Japanese Patent Application Laid-open No. Hei 7-130652. In this crystallization process, it is preferable to first remove hydrogen contained in the amorphous semiconductor layer. If crystallization is performed after the amount of contained hydrogen is made equal to or less than 5 atom % by performing heat treatment at 400 to 500° C. for approximately 1 hour, then roughness of the film surface can be prevented. Whichever method is used, the crystalline semiconductor film thus formed is selectively etched, forming the island shape semiconductor layers 1003 and 1004 in predetermined locations.

Alternatively, an SOI (silicon on insulator) substrate in which a single crystal silicon layer is formed on the substrate 1001 may also be used. There are many types known depending upon the structure and method of manufacture of the SOI substrate, and typically substrates such as SIMOX (separation by implanted oxygen), ELTRAN (epitaxial layer transfer, a trademark of Canon Corp.), or Smart-Cut (a trademark of SOITEC Corp.) can be used. Of course, it is also possible to use other SOI substrates.

A gate insulating film having a thickness of 40 to 150 nm is formed from an insulating film containing silicon by a method such as plasma CVD, sputtering, or reduced pressure CVD. For example, it may be formed from a film such as a silicon oxide film, a silicon nitride film, or a silicon nitride oxide film. This is taken as a gate insulating film 1005 having a first shape. A conductive layer 1006 is then formed on the first shape gate insulating film 1005 in order to form gate electrodes. It is preferable to form the conductive layer 1006 from a conductive material having resistance to heat. It may be formed from a single layer, and it may also have a lamination structure made from a plurality of layers, such as two layers or three layers, when necessary. For example, the conductive layer 1006 may be formed by an element selected from the group consisting of tungsten (W), tantalum (Ta), titanium (Ti), and molybdenum (Mo), or from an alloy with the above elements as constituents, or from an alloy film of a combination of the above elements. Further, the conducting layer may be formed into a lamination structure with a nitride compound of the above elements, such as tungsten nitride (WN), tantalum nitride (TaN), titanium nitride (TiN), or molybdenum nitride (MoN), or a silicide compound such as tungsten silicide, tantalum silicide, titanium silicide, or molybdenum silicide. A first shape mask 1007 is then formed. The first shape mask 1007 is formed by a photolithography technique using a resist material.

Figure 9B:
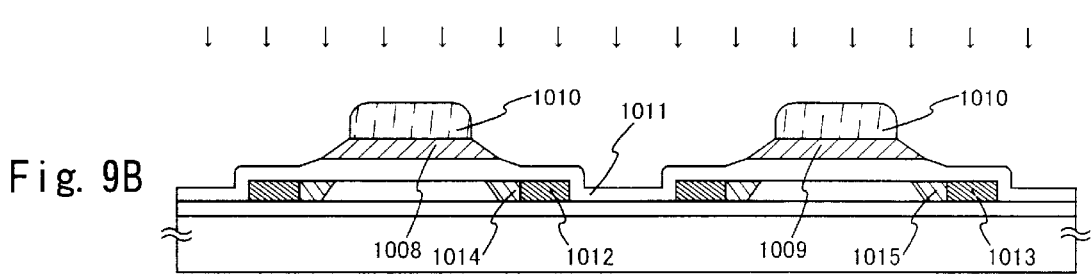

Etching of the conducting layer 1006 is performed next, as shown by FIG. 9B. The etching process is performed using a dry etching method, preferably by using an ICP etching apparatus. A gas mixture of $CF_4$ and $Cl_2$ is used as an etching gas, and a bias voltage is applied to the substrate. At the very least, conducting layers 1008 and 1009 having a first tapered shape are formed on the island shape semiconductor layers 1003 and 1004. The shape of the tapered portion can be changed in accordance with the etching gas mixture ratio, with the etching pressure, and with the bias voltage applied to the substrate. The bias voltage applied to the substrate is most suitable for controlling the tapered shape.

Dry etching is performed by elements such as fluorine (F) and chlorine (Cl), or by neutral particles or ionic particles of molecules containing fluorine or chlorine. Normally, etching proceeds in an isotropic manner if it is controlled by neutral seeds, and a tapered shape is difficult to form. Etching proceeds in an anisotropic manner by applying a positive or a negative bias voltage to the substrate. Etching for forming a tapered shape is performed by applying a bias voltage to the substrate, and by etching the resist at the same time, with the difference in etching rate between the film and the resist (also referred to as selective ratio, and expressed as the etching rate of the product to be processed/etching rate of resist) used as a value in a certain fixed range. By first making an appropriate resist shape, and then performing an etching gradually from an edge portion of the resist, a tapered shape can be formed in the film underneath. The shape of the first shape mask 1007 also changes, forming a second shape mask 1010. Further, the surface of the gate insulating film 1005 under the conductive layer 1006 is exposed as etching proceeds, and the gate insulating film is also etched to a certain extent from its surface, forming a second shape gate insulating film 1011.

The resist 1010 is then used as a mask, and a first doping process is performed. An impurity element is added to impart n-type conductivity to the island shape semiconductor layers 1003 and 1004. An ion doping method or an ion injection method in which the impurity element is ionized, accelerated by an electric field, and then injected into the semiconductor layers, is used for the doping process. An impurity element imparting n-type conductivity passes through the gate insulating film and is added to the semiconductor layers 1003 and 1004 below. A portion of the n-type conductivity imparting impurity element passes through edge portions of the first shape gate electrodes 1008 and 1009, and their vicinity, and can be added to the semiconductor layers below.

First impurity regions 1012 and 1013 contain the single conductivity type impurity element at a concentration of $1 \times 10^{20}$ to $1 \times 10^{21}$ atoms/cm$^3$. Further, the concentration of the impurity element added to the semiconductor layer in second impurity regions 1014 and 1015 is low compared to that of the first impurity regions 1012 and 1013 by the amount in which the thickness of the second shape gate insulating film 1011 increases. A uniform concentration distribution is not always able to be obtained within the second impurity element regions 1014 and 1015, but the impurity element is added so as to fall within a range of $1\times10^{17}$ to $1\times10^{20}$ atoms/cm$^3$.

The second impurity regions 1014 and 1015 are formed under the gate insulating film 1011 and the tapered portions of the conductive layers 1008 and 1009. The concentration distribution of the impurity element in the second impurity regions 1014 and 1015 decreases as distance from the first impurity regions 1012 and 1013 increases. The ratio of the decrease varies in accordance with conditions of the acceleration voltage and the dosage during ion doping, with the angle of the tapered portion, and with the thickness of the first shape gate electrodes 1008 and 1009.

Figure 9C:
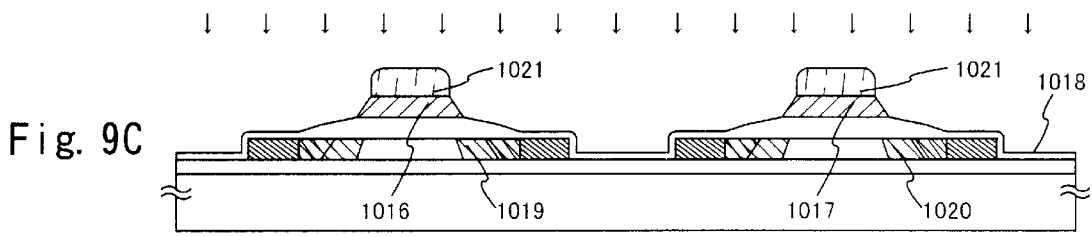

A second etching process is performed next, as shown in FIG. 9C. In the second etching process, the first shape gate electrodes 1008 and 1009 are etched so as to make the width in a channel longitudinal direction shorter. The method of etching is the same as that of the first etching process, and an ICP etching apparatus is used. A gas mixture of $CF_4$ and $Cl_2$ is used as an etching gas, and a bias voltage is applied to the substrate, forming a second shape gate electrodes 1016 and 1017. A portion of the base gate insulating film 1011 is etched from its surface in the second etching process, forming a second shape gate insulating film 1018. Tapered portions are also formed in edge portions of the conductive layers 1016 and 1017 having the second tapered shape in FIG. 9C.

A second doping process is then performed with the resist 1021 used as a mask, and the n-type conductivity imparting impurity element is added to the island shape semiconductor layers 1003 and 1004. In this case, a portion of the impurity element can pass through the edge portions of the second shape gate electrodes 1016 and 1017, and their vicinity, and can be added to the semiconductor layer below.

The second doping process is performed so that the single conductivity type impurity element is contained at a concentration of $1\times10^{16}$ to $5\times10^{18}$ atoms/cm$^3$. The single conducting type impurity element is added in this process to the first impurity regions 1012 and 1013, and to the second impurity regions 1014 and 1015 formed by the first doping process, but the amount added thereto is low, and therefore its influence can be ignored. Newly formed third impurity regions 1019 and 1020 are made to contain the single conducting type impurity element at a concentration of $1\times10^{16}$ to $5\times10^{18}$ atoms/cm$^3$. In the third impurity regions 1019 and 1020 is reduced the concentration of the impurity element added to the semiconductor layer by the amount in which the thickness of the second tapered shape gate electrodes 1016 and 1017 increase. Although a uniform concentration distribution cannot necessarily be obtained within the third impurity regions 1019 and 1020, the impurity element is made to be contained within the above concentration range.

The third impurity regions 1019 and 1020 are formed beneath the second shape gate insulating film 1018, and beneath the tapered portions of the second shape gate electrodes 1016 and 1017. Their concentration distributions decrease as distances from the first impurity regions 1012 and 1013 increase. The second shape gate electrodes 1016 and 1017 are used as gate electrodes. With the edge portions of the gate electrodes given a tapered shape, and by doping the impurity element through the tapered portions, impurity regions can thus be formed in the semiconductor layers existing under the tapered portion in which the concentration of the impurity element changes gradually. The present invention actively utilizes this impurity region. Forming this type of impurity region relieves a high electric field that develops in the vicinity of the drain region, and prevents the generation of hot carriers. Deterioration of the TFT can thus be prevented.

Figure 9D:
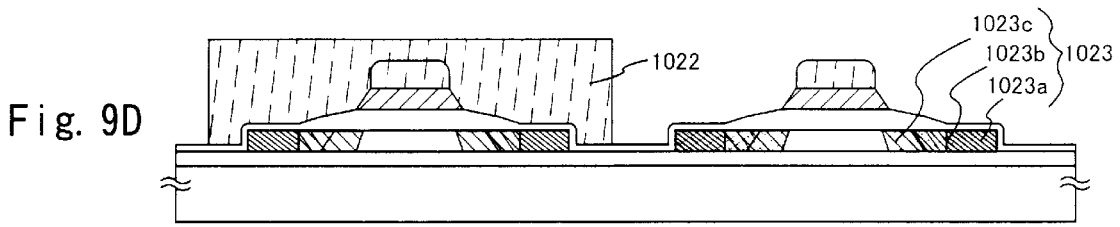

The island shape semiconductor layer 1003 is then covered with a resist mask 1022 as shown in FIG. 9D, and an impurity element which imparts p-type conductivity is added to the island shape semiconductor layer 1004. The second shape gate electrode 1017 acts as a mask in this case as well, and the p-type conductivity imparting impurity element is added, forming an impurity region in a self-aligning manner. An impurity region 1023 formed here is formed by ion doping method using diborane ($B_2H_6$). The concentration of the p-type conductivity imparting impurity element of the impurity region 1023 is set so as to be from $2\times10^{20}$ to $2\times10^{21}$ atoms/cm$^3$.

However, the impurity region 1023 can be seen in detail to be divided into three regions containing the impurity element which impart n-type conductivity. A fourth impurity region 1023*a* contains the n-type conductivity imparting element at a concentration of $1\times10^{20}$ to $1\times10^{21}$ atoms/cm$^3$, a fifth impurity region 1023*b* contains the n-type conductivity imparting element at a concentration of $1\times10^{17}$ to $1\times10^{20}$ atoms/cm$^3$, and a sixth impurity region 1023*c* contains the n-type conductivity imparting element at a concentration of $1\times10^{16}$ to $5\times10^{18}$ atoms/cm$^3$. However, the concentration of the p-type conductivity impurity element in the impurity regions 1023*b* and 1023*c* is made to be equal to or greater than $1\times10^{19}$ atoms/cm$^3$, and the concentration of the p-type conductivity imparting impurity element in the fourth impurity region 1023*a* is made to be from 1.5 to 3 times the concentration of the impurity element which imparts n-type conductivity. As a result, there develops no problem in using the fourth impurity region 1023*b* as a source region or a drain region of a p-channel TFT. Further, a portion of the sixth impurity region 1023*c* is formed so as to overlap with of the second shape gate electrode 1017.

Thus a first impurity region 1024, which becomes a source region or a drain region, a second impurity region 1025, which forms an LDD region not overlapping the gate electrode, a third impurity region 1026 which forms an LDD region a portion of which overlaps with the gate electrode, and a channel forming region 1027 are formed in the island shape semiconductor layer 1003. Further, a first impurity region 1028, which becomes a source region or a drain region, a second impurity region 1029, which forms an LDD region not overlapping the gate electrode, a third impurity region 1030 which forms an LDD region a portion of which overlaps with the gate electrode, and a channel forming region 1031 are formed in the island shape semiconductor layer 1004.

Figure 9E:
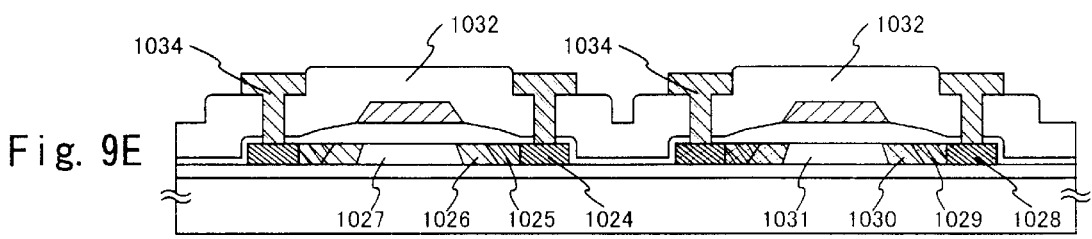

An interlayer insulating film 1032 and a wiring 1034 for forming contact with a source region or a drain region may also be formed next when necessary, as shown in FIG. 9E.

It is possible to implement Example 4 by freely combining it with any of Examples 1 to 3.

Example 5

A semiconductor device having a DAC of the present invention can be used in various electronic devices.

Examples of electronic devices which use the DAC of the present invention include: video cameras; digital cameras, goggle type displays (head mounted displays); navigation systems; audio playback devices (such as car audio systems and audio component systems); notebook personal computers; game machines; portable information terminals (such as mobile computers, portable telephones, portable game machines, and electronic books); and image reproducing devices provided with a recording medium (specifically, devices provided with displays for displaying images when playing back a recording medium such as a digital versatile disk (DVD)). Specific examples of these electronic devices are shown in FIGS. 10A to 10H.

Figure 10A:
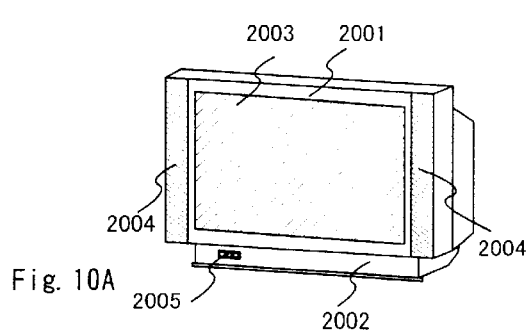
FIGS. 10A to 10H are views showing electronic appliance using the DAC of the invention.

FIG. 10A is a display device, and contains parts such as a frame 2001, a support stand 2002, a display portion 2003, a speaker portion 2004, and a video input terminal 2005. The DAC of the present invention can be used in the display portion 2003 and in other control circuits. Note that display devices include all information display devices for, for example, personal computers, television broadcast transmitter-receivers, and advertisement displays.

Figure 10B:
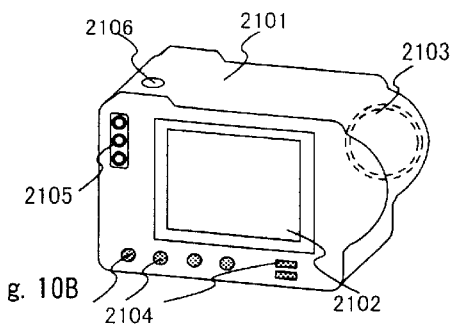

FIG. 10B is a digital still camera, which contains parts such as a main body 2101, a display portion 2102, an image receiving portion 2103, operation keys 2104, external connection ports 2105, and a shutter 2106. The DAC of the present invention can be used in the display portion 2102 and in other control circuits.

Figure 10C:
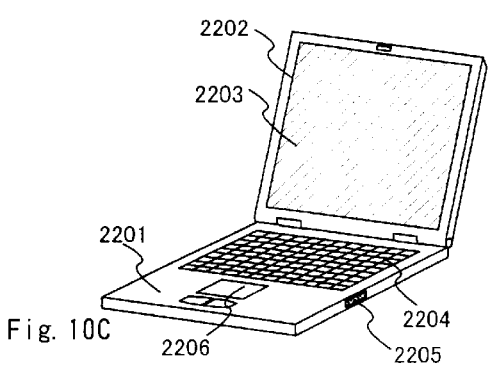

FIG. 10C is a notebook personal computer, which contains parts such as a main body 2201, a frame 2202, a display portion 2203, a keyboard 2204, external connection ports 2205, and a pointing mouse 2206. The DAC of the present invention can be used in the display portion 2203 and in other control circuits.

Figure 10D:
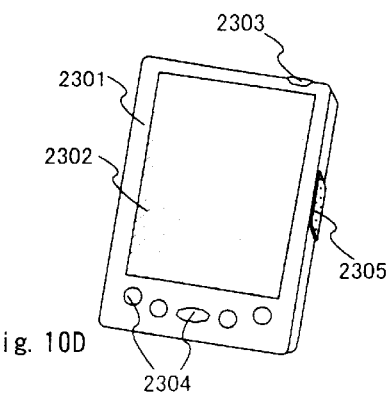

FIG. 10D is a mobile computer, which contains parts such as a main body 2301, a display portion 2302, switches 2303, operation keys 2304, and an infrared port 2305. The DAC of the present invention can be used in the display portion 2302 and in other control circuits.

Figure 10E:
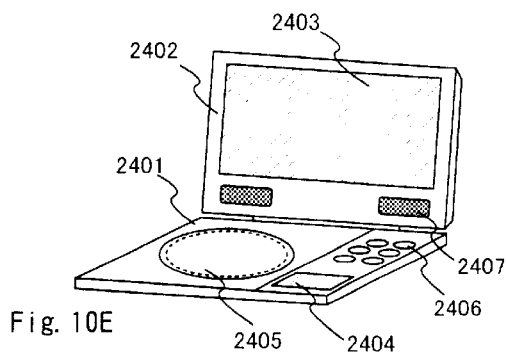

FIG. 10E is a portable image reproducing device image reproducing device provided with a recording medium (specifically, a DVD playback device), which contains parts such as a main body 2401, a frame 2402, a display portion A 2403, a display portion B 2404, a recording medium (such as a DVD) read-in portion 2405, operation keys 2406, and a speaker portion 2407. The display portion A 2403 mainly displays image information, and the display portion B 2404 mainly displays character information, and the DAC of the present invention can be used in the display portion A 2403 and in the display portion B 2404, as well as in other control circuits. Note that family game machines and the like are included in the category of image reproducing devices provided with a recording medium.

Figure 10F:
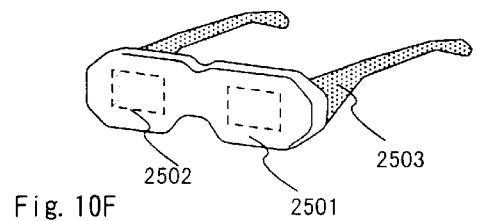

FIG. 10F is a goggle type display (head mounted display), which contains a main body 2501, a display portion 2502, and arm portions 2503. The DAC of the present invention can be used in the display portion 2502 and in other control circuits.

Figure 10G:
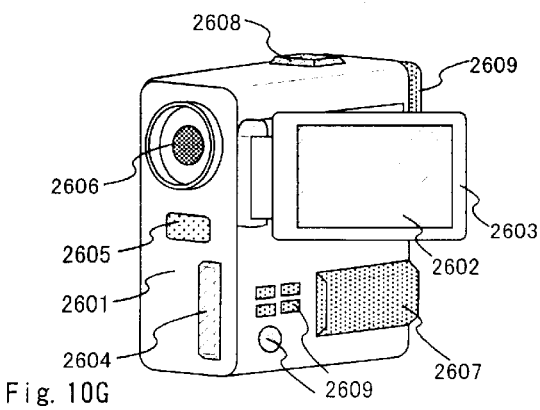

FIG. 10G is a video camera, which contains parts such as a main body 2601, a display portion 2602, a frame 2603, external connection ports 2604, a remote control signal receiving portion 2605, an image receiving portion 2606, a battery 2607, an audio input portion 2608 and an operation keys 2609. The DAC of the present invention can be used in the display portion 2602 and in other control circuits.

Figure 10H:
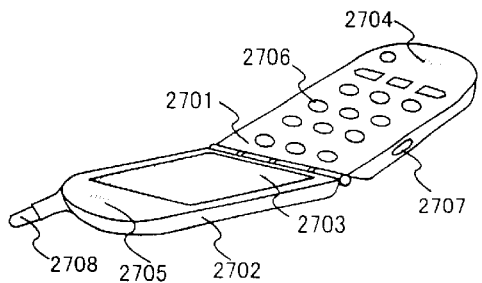
Figure 11:
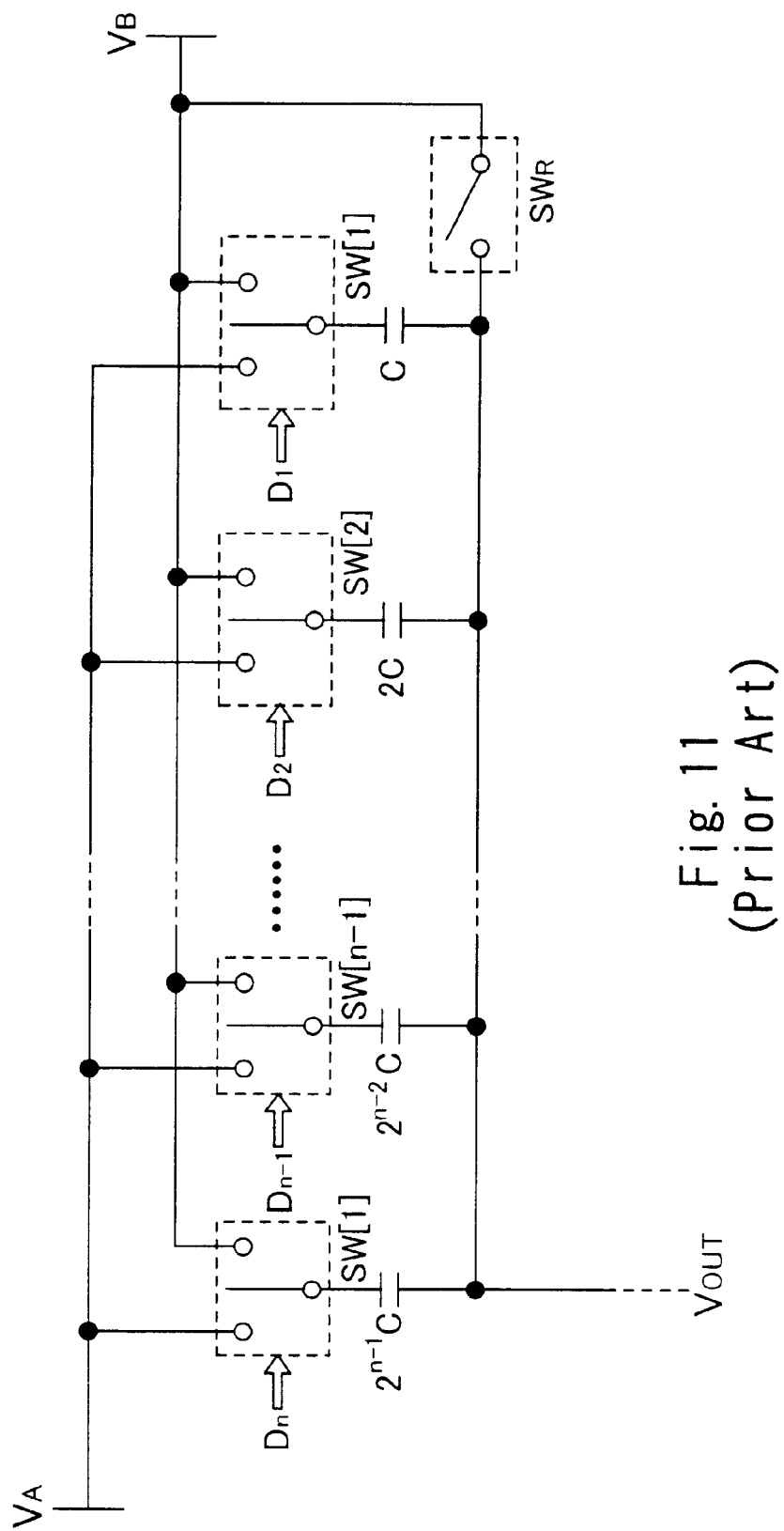
FIG. 11 is a diagram showing a configuration of a prior-art capacitive divider type DAC.
Figure 12A:
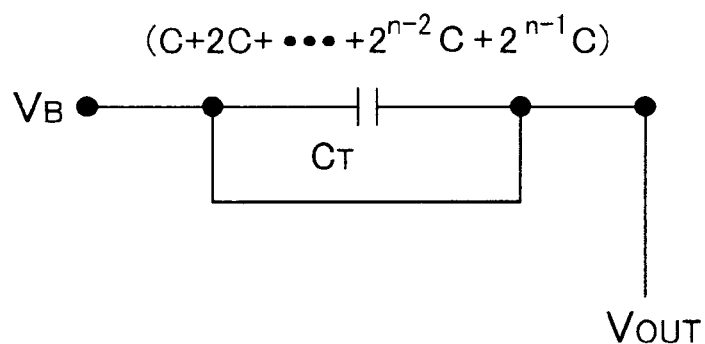
FIGS. 12A and 12B are equivalent circuit diagrams showing the prior-art capacitive divider type DAC.
Figure 12B:
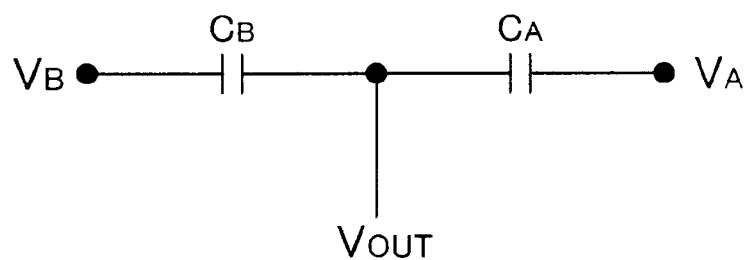

FIG. 10H is a portable telephone, which contains parts such as a main body 2701, a frame 2702, a display portion 2703, an audio input portion 2704, an audio output portion 2705, operation keys 2706, an external connection portion 2707, and an antenna 2708. The DAC of the present invention can be used in the display portion 2703 and in other control circuits.

Further, the aforementioned electronic devices often display information received through electronic communication lines such as the Internet and CATV (cable television), and opportunities for displaying moving pictures in particular have increased. The DAC of the present invention is capable of high speed operation, is capable of converting a high bit number of digital signal into an analog signal, and can ensure linearity of the output analog signal. The DAC of the present invention is therefore valuable.

The applicable range of the DAC of the present invention is thus extremely wide, and the DAC of the present invention can be used in electronic equipment in all fields. Further, the electronic devices of Example 5 may use DACs having any of the structures shown in Examples 1 to 4.

With the configuration of the invention, a DAC can be formed corresponding to the higher order bit digital signals without losing linearity while making use of the merit of the capacitive divider type that is capable of driving at high speed and suppressing area comparatively small.

What is claimed is:

1. A D/A converter circuit for converting n-bit digital signals (n is a natural number) into an analog signal, comprising:

capacitances in the number of m (m is a natural number smaller than n) each having first and second electrodes;

tone voltage lines in the number of $2^{n-m}$ different in voltage value one from another; and first switches in the number of $2^{n-m}$, second switches in the number of m and a third switch, wherein the capacitances in the number of m are charged under control of by higher order (n–m)-bit digital signals of among the n-bit digital signals in a precharge period;

wherein the capacitances in the number of m are charged under control of by lower order m-bit digital signals of among the n-bit digital signals in a write period;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of $2^{n-m}$;

wherein the other terminal of the third switch are connected to the second electrodes possessed by all the capacitances in the number of m; and wherein voltages on the second electrodes possessed by all the capacitances in the number of m are outputted as an analog signal.

2. A D/A converter circuit for converting n-bit digital signals (n is a natural number) into an analog signal, comprising:

capacitances in the number of m (m is a natural number smaller than n) each having first and second electrodes;

tone voltage lines in the number of $2^{n-m}$ different in voltage value one from another; and first switches in the number of $2^{n-m}$, second switches in the number of m and a third switch, wherein the capacitances in the number of m are charged under control of by higher order (n–m)-bit digital signals of among the n-bit digital signals in a precharge period;

wherein the capacitances in the number of m are charged under control of by lower order m-bit digital signals of among the n-bit digital signals in a write period;

wherein the capacitances in the number of m respectively has capacitance values represented as C, 2C, $2^2$C, ... , $2^{m-1}$C;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of $2^{n-m}$;

wherein the other terminal of the third switch are connected to the second electrodes possessed by all the capacitances in the number of m; and wherein voltages on the second electrodes possessed by all the capacitances in the number of m are outputted as an analog signal.

3. A D/A converter circuit for converting n-bit digital signals (n is a natural number) into an analog signal, comprising:

capacitances in the number of m (m is a natural number smaller than n) and resistances in the number of $2^{n-m}$ each having first and second electrodes;

tone voltage lines in the number of $2^{n-m}$ different in voltage value one from another; and first switches in the number of $2^{n-m}$, second switches in the number of m and a third switch, wherein the capacitances in the number of m are charged with a charge determined by higher order (n−m)-bit digital signals of among the n-bit digital signals and the resistances in the number of $2^{n-m}$ in a precharge period; and wherein the capacitances in the number of m are charged with a charge determined by lower order m-bit digital signals of among the n-bit digital signals in a write period;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of of $2^{n-m}$;

wherein the other terminal of the third switch are connected to the second electrodes possessed by all the capacitances in the number of m; and wherein voltages on the second electrodes possessed by all the capacitances in the number of m are outputted as an analog signal.

4. A D/A converter circuit for converting n-bit digital signals (n is a natural number) into an analog signal, comprising:

capacitances in the number of m (m is a natural number smaller than n) and resistances in the number of $2^{n-m}$ each having first and second electrodes;

tone voltage lines in the number of $2^{n-m}$ different in voltage value one from another; and first switches in the number of $2^{n-m}$, second switches in the number of m and a third switch, wherein the capacitances in the number of m are charged with a charge determined by higher order (n−m)-bit digital signals of among the n-bit digital signals and the resistances in the number of $2^{n-m}$ in a precharge period;

wherein the resistances in the number of $2^{n-m}$ all has a same resistance value;

wherein the capacitances in the number of m are charged with a charge determined by lower order m-bit digital signals of among the n-bit digital signals in a write period;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of of $2^{n-m}$;

wherein the other terminal of the third switch are connected to the second electrodes possessed by all the capacitances in the number of m; and wherein voltages on the second electrodes possessed by all the capacitances in the number of m are outputted as an analog signal.

5. A D/A converter circuit according to claim 3 or 4, wherein the resistances in the number of $2^{n-m}$ are connected in series.

6. A D/A converter circuit according to claim 3 or 4, wherein among the resistances in the number of $2^{n-m}$, two resistances each having one terminal not connected to another resistance are connected at the terminals respectively to a lower-voltage power source and a higher voltage power source.

7. A D/A converter circuit for converting n-bit digital signals (n is a natural number) into an analog signal, comprising:

capacitances in the number of m (m is a natural number smaller than n) each having first and second electrodes and tone voltage lines in the number of $2^{n-m}$; and first switches in the number of $2^{n-m}$, second switches in the number of m and a third switch, wherein one of the tone voltage lines in the number of $2^{n-m}$ is selected by higher order (m-bit digital signals of among the n-bit digital signals in a precharge period;

wherein the capacitances in the number of m are charged by a voltage on the selected tone voltage line;

wherein the capacitances in the number of m are charged under control of lower m-bit digital signals of among the n-bit digital signals in a write period;

wherein the capacitances in the number of m respectively have capacitance values represented as C, 2C, $2^2$C, ..., $2^{m-1}$C;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of of $2^{n-m}$;

wherein the other terminal of the third switch are connected to the second electrodes possessed by all the capacitances in the number of m; and wherein voltages on the second electrodes possessed by all the capacitances in the number of m are outputted as an analog signal.

8. A D/A converter circuit for converting n-bit digital signals (n is a natural number) into an analog signal, comprising:

capacitances in the number of m (m is a natural number smaller than n) each having first and second electrodes, resistances in the number of $2^{n-m}$ each having first and second terminals, first switches in the number of $2^{n-m}$, second switches in the number of m and a third switch;

wherein the first electrodes possessed by all the capacitances in the number of m are connected to either one of a first power source or a second power source respectively through second switches in the number of m;

wherein the resistances in the number of $2^{n-m}$ all are the same in resistance value;

wherein the resistances in the number of $2^{n-m}$ are connected in series by connecting the first terminal with the second terminal of the other resistance;

wherein the resistance of among the resistances in the number of $2^{n-m}$ not connected at the first terminal with the second terminal are connected at the first terminal to a third power source;

wherein the resistance of among the resistances in the number of $2^{n-m}$ not connected at the second terminal with the first terminal of the other resistance are connected at the second terminal to a fourth power source;

wherein the second terminals respectively possessed by the resistances in the number of $2^{n-m}$ being connected to one terminal of the third switch respectively through the first switches in the number of $2^{n-m}$;

wherein the other terminal of the third switch are connected to the second electrodes possessed by all the capacitances in the number of m;

wherein voltages on the second electrodes possessed by all the capacitances in the number of m are outputted as an analog signal.

9. A D/A converter circuit for converting n-bit digital signals (n is a natural number) into an analog signal, comprising:

capacitances in the number of m (m is a natural number smaller than n) each having first and second electrodes, resistances in the number of $2^{n-m}$ each having first and second terminals, first switches in the number of $2^{n-m}$, second switches in the number of m and a third switch;

wherein the resistances in the number of $2^{n-m}$ are all the same in resistance value;

wherein the resistances in the number of $2^{n-m}$ are connected in series by connecting the first terminal with the second terminal of the other resistance;

wherein the resistance of among the resistances in the number of $2^{n-m}$ not connected at the first terminal with the second terminal of the other resistance are connected at the first terminal to a third power source;

wherein the resistance of among the resistances in the number of $2^{n-m}$ not connected at the second terminal with the first terminal of the other resistance are connected at the second terminal to a fourth power source;

wherein the second terminals respectively possessed by the resistances in the number of $2^{n-m}$ are connected to one terminal of the third switch respectively through the first switches in the number of $2^{n-m}$;

wherein the other terminal of the third switch are connected to the second electrodes possessed by all the capacitances in the number of m;

wherein, in a precharge period, only any one of the first switches in the number of $2^{n-m}$ is turned on by higher order (n–m)-bit digital signals of among the n-bit digital signals, the first electrodes possessed by all the capacitances in the number of m are connected to the first power source, and the third switch is turned on;

wherein, in a write period, the second switches in the number of m being controlled by lower order m-bit digital signals of among the n-bit digital signals thereby connecting the first electrodes possessed by the capacitances in the number of m to either one of the first power source or the second power source and turning off the third switch;

wherein voltages on the second electrodes possessed by all the capacitances in the number of m are outputted as an analog signal.

10. A D/A converter circuit according to claim 8 or 9, wherein the capacitances in the number of m have capacitance values respectively represented as C, 2C, $2^2$C, . . . , $2^{m-1}$C.

11. A D/A converter circuit for converting n-bit digital signals (n is a natural number) into an analog signal, comprising:

capacitances in the number of m (m is a natural number smaller than n) each having first and second electrodes, tone voltage lines in the number of $2^{n-m}$ different in voltage value one from another, first switches in the number of $2^{n-m}$, second switches in the number of m and a third switch;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of $2^{n-m}$;

wherein the other terminal of the third switch are connected to the second electrodes possessed by all the capacitances in the number of m;

wherein voltages on the second electrodes possessed by all the capacitances in the number of m are outputted as an analog signal.

12. A D/A converter circuit for converting n-bit digital signals (n is a natural number) into an analog signal, comprising:

capacitances in the number of m (m is a natural number smaller than n) each having first and second electrodes, tone voltage lines in the number of $2^{n-m}$ different in voltage value one from another, first switches in the number of $2^{n-m}$, second switches in the number of m and a third switch;

wherein the tone voltage lines in the number of $2^{n-m}$ are connected to one terminal of the third switch respectively through the first switches in the number of $2^{n-m}$;

wherein the other terminal of the third switch are connected to the second electrodes possessed by all the capacitances in the number of m;

wherein, in a precharge period, only any one of the first switches in the number of $2^{n-m}$ is turned on by higher order (n–m)-bit digital signals of among the n-bit digital signals, the first electrodes possessed by all the capacitances in the number of m are connected to the first power source, and the third switch is turned on;

wherein, in a write period, the second switches in the number of m being controlled by lower order m-bit digital signals of among the n-bit digital signals thereby connecting the first electrodes possessed by the capacitances in the number of m to either one of the first power source or the second power source and turning off the third switch;

wherein voltages on the second electrodes possessed by all the capacitances in the number of m are outputted as an analog signal.

13. A D/A converter circuit according to claim 11 or 12, wherein the capacitances in the number of m have capacitance values respectively represented as $C, 2^2C, \ldots, 2^{m-1}C$.

14. A D/A converter circuit according to claim 11 or 12, wherein the tone voltage lines in the number of $2^{n-m}$ are respectively kept at $V_B+(V_A-V_B)/2^{n-m}$, $V_B+2(V_A-V_B)/2^{n-m}, \ldots, V_B+(2^{n-m}-1)(V_A-V_B)/2^{n-m}$ and $V_B$ by a third power source or a fourth power source.

15. A D/A converter circuit according to claim 11 or 12, wherein the tone voltage lines in the number of $2^{n-m}$ are respectively kept at $V_A+(V_B-V_A)/2^{n-m}$, $V_A+2(V_B-V_A)/2^{n-m}, \ldots, V_A+(2^{n-m}-1)(V_B-V_A)/2^{n-m}$ and $V_A$ by a third power source or a fourth power source.

16. A D/A converter circuit according to any one of claims 8, 9, 11 and 12, wherein, provided that the first power source has a voltage of $V_C$, the second power source has a voltage $V_D$, the third power source has a voltage of $V_A$, the fourth power source has a voltage of $V_B$ and an interconnection to input the analog signal has a capacitance of $C_W$, the following Equation 1 is satisfied:

$$(V_D - V_C) = \frac{1}{2^n \cdot C}(V_B - V_A)\{C_W + C \cdot (2^m - 1)\}. \quad \text{[Equation 1]}$$

17. A semiconductor device having the D/A converter circuit according to any one of claims 1–4 and 7–9, 11 and 12.

18. A semiconductor device comprising:

a D/A converter circuit for converting n-bit digital signals (n is a natural number) into an analog signal;

wherein the D/A converter circuit has capacitances in the number of m (m is a natural number smaller than n) each having first and second electrodes, tone voltage lines in the number of $2^{n-m}$ different in voltage value one from another, first switches in the number of $2^{n-m}$, second switches in the number of m and a third switch, and resistances in the number of $2^{n-m}$;

wherein the capacitances in the number of m are charged with a charge determined by higher order (n–m)-bit digital signals of among the n-bit digital signals and the resistances in the number of $2^{n-m}$ in a precharge period;

wherein the capacitances in the number of m are charged with a charge determined by lower order m-bit digital signals of among the n-bit digital signals in a write period;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of $2^{n-m}$;

wherein the other terminal of the third switch are connected to the second electrodes possessed by all the capacitances in the number of m; and wherein voltages on the second electrodes possessed by all the capacitances in the number of m are outputted as an analog signal.

19. A semiconductor device according to claim 18, wherein the resistances in the number of $2^{n-m}$ are connected in series.

20. A semiconductor device according to claim 18, wherein said semiconductor device is selected from the group consisting of a display, a digital still camera, a notebook personal computer, a mobile computer, a DVD player, a head-mount display, a video camera and a cellular phone.

21. A semiconductor device comprising:

a D/A converter circuit for converting n-bit digital signals (n is a natural number) into an analog signal;

wherein the D/A converter circuit has capacitances in the number of m (m is a natural number smaller than n) each having first and second electrodes, tone voltage lines in the number of $2^{n-m}$ different in voltage value one from another, first switches in the number of $2^{n-m}$, second switches in the number of m and a third switch;

wherein the first electrodes possessed by all the capacitances in the number of m are connected to either one of a first power source or a second power source respectively through the second switches in the number of m;

wherein the tone voltage lines in the number of $2^{n-m}$ are connected to one terminal of the third switch respectively through the first switches in the number of $2^{n-m}$;

wherein the other terminal of the third switch are connected to the second electrodes possessed by all the capacitances in the number of m;

wherein voltages on the second electrodes possessed by all the capacitances in the number of m are outputted as an analog signal.

22. A semiconductor device according to claim 21, wherein the capacitances in the number of m have capacitance values respectively represented as $C, 2^2C, \ldots, 2^{m-1}C$.

23. A semiconductor device according to claim 21, wherein the tone voltage lines in the number of $2^{n-m}$ are respectively kept at $V_B+(V_A-V_B)/2^{n-m}$, $V_B+2(V_A-V_B)/2^{n-m}, \ldots, V_B+(2^{n-m}-1)(V_A-V_B)/2^{n-m}$ and $V_B$ by a third power source or a fourth power source.

24. A semiconductor device according to claim 21, wherein the tone voltage lines in the number of $2^{n-m}$ are respectively kept at $V_A+(V_B-V_A)/2^{n-m}$, $V_A+2(V_B-V_A)/2^{n-m}, \ldots, V_A+(2^{n-m}-1)(V_B-V_A)/2^{n-m}$ and $V_A$ by a third power source or a fourth power source.

25. A semiconductor device according to claim 21, wherein said semiconductor device is selected from the group consisting of a display, a digital still camera, a notebook personal computer, a mobile computer, a DVD player, a head-mount display, a video camera and a cellular phone.

* * * * *